United States Patent
Iguchi et al.

(10) Patent No.: US 9,048,224 B2
(45) Date of Patent: Jun. 2, 2015

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Tadashi Iguchi, Mie-ken (JP); Ryota Katsumata, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 56 days.

(21) Appl. No.: 14/042,030

(22) Filed: Sep. 30, 2013

(65) Prior Publication Data

US 2014/0027836 A1   Jan. 30, 2014

Related U.S. Application Data

(62) Division of application No. 13/236,833, filed on Sep. 20, 2011, now abandoned.

(30) Foreign Application Priority Data

Mar. 25, 2011 (JP) ................. 2011-067635

(51) Int. Cl.
| | |
|---|---|
| *H01L 23/48* | (2006.01) |
| *H01L 27/115* | (2006.01) |
| *H01L 21/28* | (2006.01) |

(52) U.S. Cl.
CPC ........ *H01L 23/481* (2013.01); *H01L 21/28282* (2013.01); *H01L 27/11582* (2013.01); *H01L 27/11578* (2013.01); *H01L 2924/0002* (2013.01)

(58) Field of Classification Search
CPC ............ H01L 21/28282; H01L 23/481; H01L 27/1158; H01L 27/11582
USPC ....................................... 438/628
See application file for complete search history.

(56) References Cited

U.S. PATENT DOCUMENTS

| | | |
|---|---|---|
| 2010/0038699 A1 | 2/2010 | Katsumata et al. |
| 2010/0044776 A1 | 2/2010 | Ishiduki et al. |

(Continued)

FOREIGN PATENT DOCUMENTS

| | | |
|---|---|---|
| JP | 2010-192569 | 9/2010 |
| KR | 10-2010-0054100 | 5/2010 |
| KR | 10-2010-0116198 | 10/2010 |

OTHER PUBLICATIONS

Office Action issued Apr. 29, 2013 in Korean Patent Application No. 10-2011-91273 (w/ English translation).

(Continued)

*Primary Examiner* — Caleb Henry
*Assistant Examiner* — Mounir Amer
(74) *Attorney, Agent, or Firm* — Oblon, McClelland, Maier & Neustadt, L.L.P.

(57) ABSTRACT

According to one embodiment, a nonvolatile semiconductor memory device includes: first and second stacked bodies, first and second semiconductor pillars, a connection portion, a memory film, and a partitioning insulating layer. The stacked bodes include electrode films stacked along a first axis and an inter-electrode insulating film provided between the electrode films. Through-holes are provided in the stacked bodies. The semiconductor pillars are filled into the through-holes. The connection portion electrically connects the semiconductor pillars. The memory film is provided between the semiconductor pillars and the electrode films. The partitioning insulating layer partitions the first and second electrode films. A side surface of the first through-hole on the partitioning insulating layer side and a side surface of the second through-hole on the partitioning insulating layer side have a portion parallel to a plane orthogonal to a second axis from the first stacked body to the second stacked body.

11 Claims, 19 Drawing Sheets

(56) References Cited

U.S. PATENT DOCUMENTS

| | | |
|---|---|---|
| 2010/0096682 A1 | 4/2010 | Fukuzumi et al. |
| 2010/0207195 A1 | 8/2010 | Fukuzumi et al. |
| 2010/0224928 A1 | 9/2010 | Fukuzumi et al. |
| 2011/0065270 A1 | 3/2011 | Shim et al. |
| 2012/0001250 A1 | 1/2012 | Alsmeier |

OTHER PUBLICATIONS

Office Action issued Jul. 26, 2013 in Japanese Application No. 2011-067635 filed Mar. 25, 2011 (w/English translation).

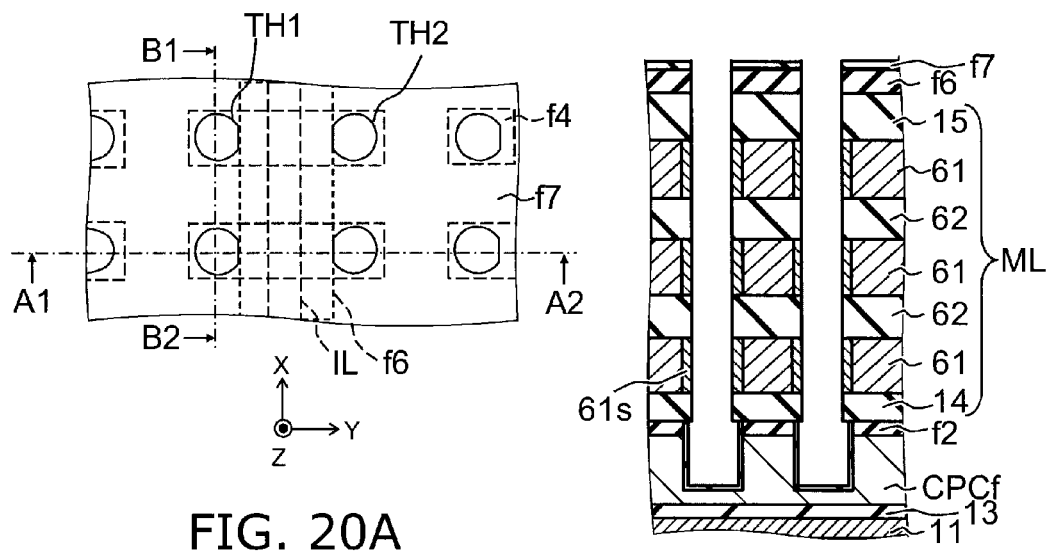
FIG. 20A
FIG. 20B
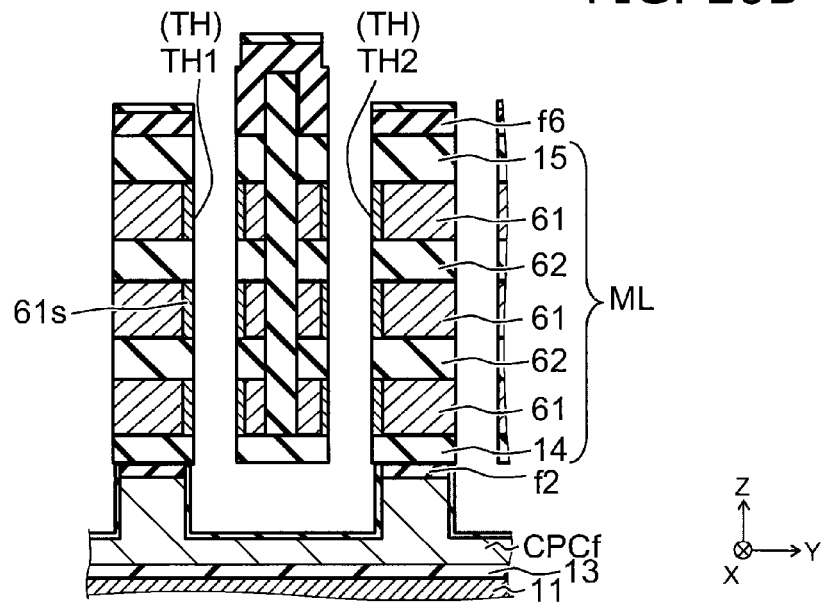
FIG. 20C

NONVOLATILE SEMICONDUCTOR MEMORY DEVICE AND METHOD FOR MANUFACTURING SAME

CROSS-REFERENCE TO RELATED APPLICATIONS

This application is a division of and claims the benefit of priority under 35 U.S.C. §120 from U.S. Ser. No. 13/236,833 filed Sep. 20, 2011, and claims the benefit of priority under 35 U.S.C. §119 from Japanese Patent Application No. 2011-067635 filed Mar. 25, 2011; the entire contents of each of which are incorporated herein by reference.

FIELD

Embodiments described herein relate generally to a nonvolatile semiconductor memory device, and a method for manufacturing the same.

BACKGROUND

Three-dimensionally stacked memory has been proposed to increase the storage capacity of nonvolatile semiconductor memory devices. In a three-dimensionally stacked memory, for example, a stacked body including alternately stacked insulating films and electrode films, a silicon pillar that pierces the stacked body in the stacking direction, and a memory film interposed between the silicon pillar and the electrode films are provided. Thereby, a memory cell is provided at the intersection between the silicon pillar and each of the electrode films. Further, a configuration is conceivable in which a memory string has a U-shaped configuration in which two silicon pillars are connected on the substrate side.

Such a three-dimensionally stacked memory is expected to further reduce the size of the memory cells and further increase the storage density.

BRIEF DESCRIPTION OF THE DRAWINGS

FIG. 20A to FIG. 20C are schematic views illustrating the method for manufacturing the nonvolatile semiconductor memory device according to the embodiment.

DETAILED DESCRIPTION

Figure 1:
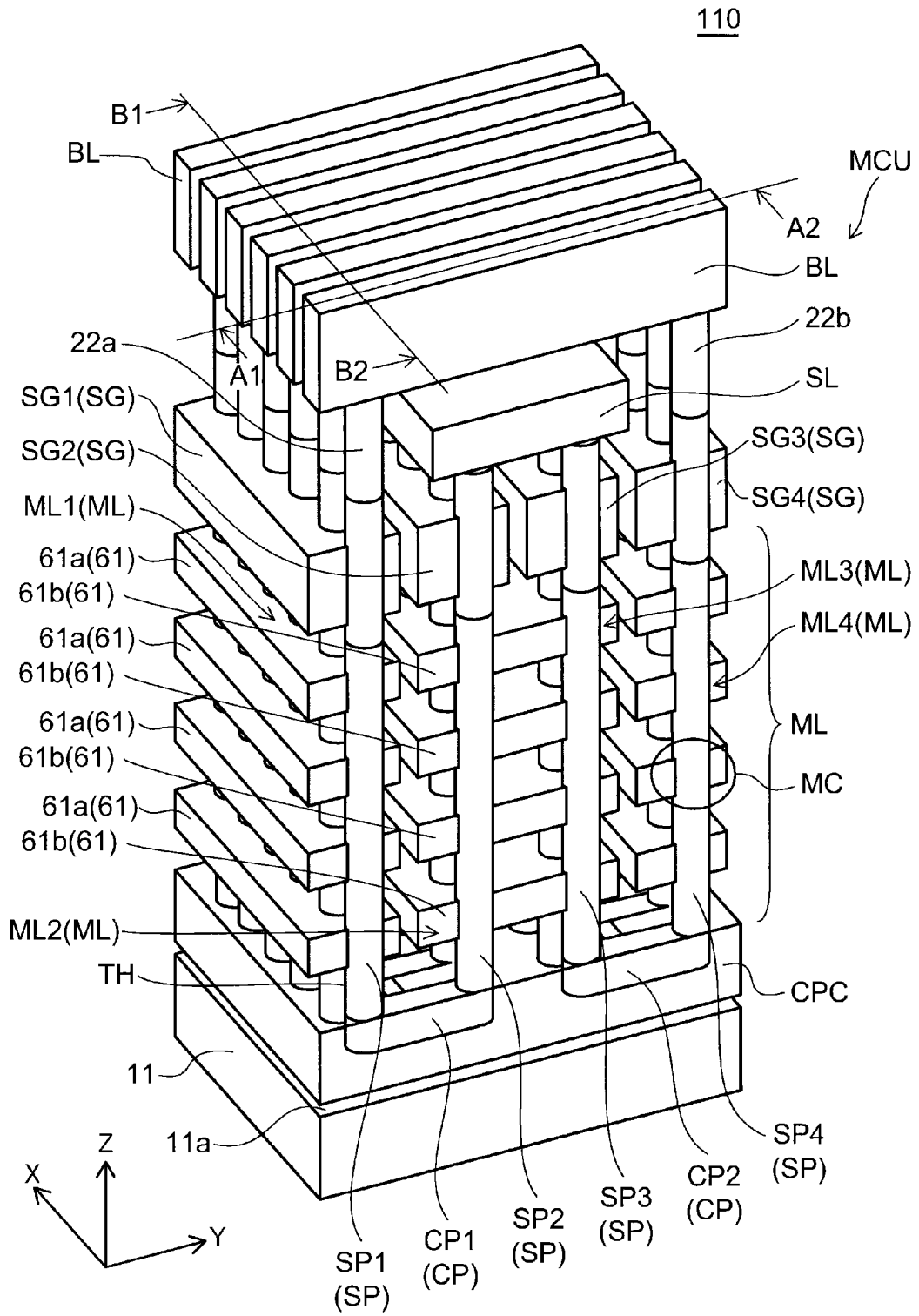
FIG. 1 is a schematic perspective view illustrating the configuration of a nonvolatile semiconductor memory device according to an embodiment.

In general, according to one embodiment, a nonvolatile semiconductor memory device includes: a first stacked body, a first semiconductor pillar, a second stacked body, a second semiconductor pillar, a connection portion, a memory film, and a partitioning insulating layer. The first stacked body includes a plurality of first electrode films stacked along a first axis and a first inter-electrode insulating film provided between two of the first electrode films mutually adjacent along the first axis. A first through-hole is provided in the first stacked body to extend along the first axis. The first semiconductor pillar is filled into the first through-hole to extend along the first axis. The second stacked body is juxtaposed with the first stacked body along a second axis orthogonal to the first axis. The second stacked body includes a plurality of second electrode films stacked along the first axis and a second inter-electrode insulating film provided between two of the second electrode films mutually adjacent along the first axis. A second through-hole is provided in the second stacked body to extend along the first axis. The second semiconductor pillar is filled into the second through-hole to extend along the first axis. The connection portion electrically connects the first semiconductor pillar to the second semiconductor pillar.

The memory film is provided between the first semiconductor pillar and the plurality of first electrode films and between the second semiconductor pillar and the plurality of second electrode films. The partitioning insulating layer is provided between the first stacked body and the second stacked body to partition the plurality of first electrode films from the plurality of second electrode films. At least one selected from a side surface of the first through-hole on the partitioning insulating layer side and a side surface of the second through-hole on the partitioning insulating layer side is configured to have a portion parallel to a plane including the first axis and a third axis orthogonal to the first and second axes.

According to another embodiment, a method for manufacturing a nonvolatile semiconductor memory device is disclosed. The device includes: a first stacked body, a first semiconductor pillar, a second stacked body, a second semiconductor pillar, a connection portion, a memory film, and a partitioning insulating layer. The first stacked body includes a plurality of first electrode films stacked along a first axis and a first inter-electrode insulating film provided between two of the first electrode films mutually adjacent along the first axis. A first through-hole is provided in the first stacked body to extend along the first axis. The first semiconductor pillar is filled into the first through-hole to extend along the first axis. The second stacked body is juxtaposed with the first stacked body along a second axis orthogonal to the first axis. The second stacked body includes a plurality of second electrode films stacked along the first axis and a second inter-electrode insulating film provided between two of the second electrode films mutually adjacent along the first axis. A second through-hole is provided in the second stacked body to extend along the first axis. The second semiconductor pillar is filled into the second through-hole to extend along the first axis. The connection portion electrically connects the first semiconductor pillar to the second semiconductor pillar. The partitioning insulating layer provided between the first stacked body and the second stacked body to partition the plurality of first electrode films from the plurality of second electrode films. The memory film is provided between the first semiconductor pillar and the plurality of first electrode films and between the second semiconductor pillar and the plurality of second electrode films. The method can form the partitioning insulating layer in a stacked main body used to form the first stacked body and the second stacked body. The method can form a sidewall mask layer on a sidewall of a portion of the partitioning insulating layer. In addition, the method can make the first through-hole and the second through-hole in the stacked main body by using the sidewall mask layer as a portion of a mask.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

EMBODIMENT

FIG. 1 is a schematic perspective view illustrating the configuration of a nonvolatile semiconductor memory device according to an embodiment.

For easier viewing of the drawing in FIG. 1, conductive portions are illustrated and insulating portions are not illustrated. As illustrated in FIG. 1, the nonvolatile semiconductor memory device 110 according to the embodiment includes a memory cell array unit MCU. Multiple memory cells MC are provided in the memory cell array unit MCU. An example of a configuration of the memory cell MC is described below.

The memory cell array unit MCU is provided on, for example, a major surface 11a of a substrate 11.

The substrate 11 may include, for example, a semiconductor substrate. The substrate 11 may include, for example, a silicon substrate.

Herein, an axis perpendicular to the major surface 11a of the substrate 11 is taken as a Z axis (a first axis). One axis perpendicular to the Z axis is taken as a Y axis (a second axis). An axis perpendicular to the Z axis and the Y axis is taken as an X axis (a third axis).

The memory cell array unit MCU includes a stacked body ML, a semiconductor pillar SP, and a not-illustrated memory film.

The stacked body ML includes multiple electrode films 61 stacked along the Z axis and an inter-electrode insulating film (not illustrated in FIG. 1) provided between the multiple electrode films 61.

In the specification of the application, stacking includes not only the case of being overlaid in direct contact but also the case of being overlaid with another component inserted therebetween.

The semiconductor pillar SP pierces the stacked body ML along the Z axis. Namely, the semiconductor pillar SP pierces the electrode films 61 along the Z axis. As described below, the memory film is provided between the semiconductor pillar SP and the multiple electrode films 61.

The memory cells MC (the memory cell transistors) are formed at portions where the multiple electrode films 61 intersect the semiconductor pillar SP.

Specifically, multiple stacked bodies ML include, for example, first to fourth stacked bodies ML1 to ML4, etc. The multiple stacked bodies ML have portions extending along, for example, the X axis. The multiple stacked bodies ML are juxtaposed along, for example, the Y axis. Each of the multiple stacked bodies ML includes the multiple electrode films 61 stacked along the Z axis and an inter-electrode insulating film (not illustrated in this drawing) provided between two electrode films 61 mutually adjacent along the Z axis.

The first stacked body ML1 includes multiple first electrode films 61a. The second stacked body ML2 includes multiple second electrode films 61b. In this example, the multiple electrode films 61 included in the third stacked body ML3 are continuous from the multiple second electrode films 61b respectively. Although the second stacked body ML2 and the third stacked body ML3 are continuous from each other, these are called the second stacked body ML2 and the third stacked body ML3 respectively for convenience. In this example as described below, the multiple electrode films 61 included in the fourth stacked body ML4 are electrically connected to the multiple first electrode films 61a.

The multiple electrode films 61 have portions extending along the X axis.

Although the case is illustrated where the number of the electrode films 61 is four for easier viewing of the drawing in FIG. 1, the number of the electrode films 61 of the embodiment is arbitrary.

For example, the multiple semiconductor pillars SP are taken as the first to fourth semiconductor pillars SP1 to SP4. The first to fourth semiconductor pillars SP1 to SP4 pierce the first to fourth stacked bodies ML1 to ML4 respectively.

The first to fourth semiconductor pillars SP1 to SP4 are juxtaposed along, for example, the Y axis. The second semiconductor pillar SP is disposed between the first semiconductor pillar SP1 and the fourth semiconductor pillar SP4. The third semiconductor pillar SP3 is disposed between the second semiconductor pillar SP2 and the fourth semiconductor pillar SP4.

One end of the first semiconductor pillar SP1 is electrically connected to one end of the second semiconductor pillar SP2 by a first connection portion CP1 (a connection portion CP). One end of the third semiconductor pillar SP3 is electrically connected to one end of the fourth semiconductor pillar SP4 by a second connection portion CP2. The one end recited above is the end on the substrate 11 side.

The other end of the first semiconductor pillar SP1 is connected to a bit line BL by a contact via 22a. The other end of the fourth semiconductor pillar SP4 is connected to the bit line BL by a contact via 22b. The other end of the second semiconductor pillar SP2 and the other end of the third semiconductor pillar SP3 are connected to a source line SL.

First to fourth selection gate electrodes SG1 to SG4 are provided between the first stacked body ML1 and the bit line BL, between the second stacked body ML2 and the source line SL, between the third stacked body ML3 and the source line SL, and between the fourth stacked body ML4 and the bit line BL, respectively. The first to fourth selection gate electrodes SG1 to SG4 are any of the multiple selection gate electrodes SG. The first to fourth selection gate electrodes SG1 to SG4 extend along the X axis.

For example, through-holes TH extending in the Z axis are provided in the multiple stacked bodies ML. The semiconductor pillars SP are formed by filling a semiconductor material into the through-holes TH.

Multiple semiconductor pillars SP may be provided to be juxtaposed along the X axis for one of the electrode films 61. The multiple semiconductor pillars SP are provided in a matrix configuration along the X axis and the Y axis. The memory cells MC are formed respectively at portions where the multiple semiconductor pillars SP intersect the multiple electrode films 61 stacked along the Z axis. The memory cells MC are provided in a three-dimensional matrix configuration along the Z axis, the X axis, and the Y axis.

The connection portions CP may include, for example, the semiconductor material used in the semiconductor pillars SP.

The memory cell array unit MCU may further include a connection portion conductive layer CPC opposing the connection portions CP. For example, trenches are provided in the connection portion conductive layer CPC; and the connection portions CP are formed by filling a semiconductor material into the trenches. The two semiconductor pillars SP connected to each of the connection portions CP are electrically connected to each other by controlling the potential of the connection portion conductive layer CPC.

The connected first semiconductor pillar SP1 and second semiconductor pillar SP2 form a memory string. The connected third semiconductor pillar SP3 and fourth semiconductor pillar SP4 form another memory string.

Figure 2:
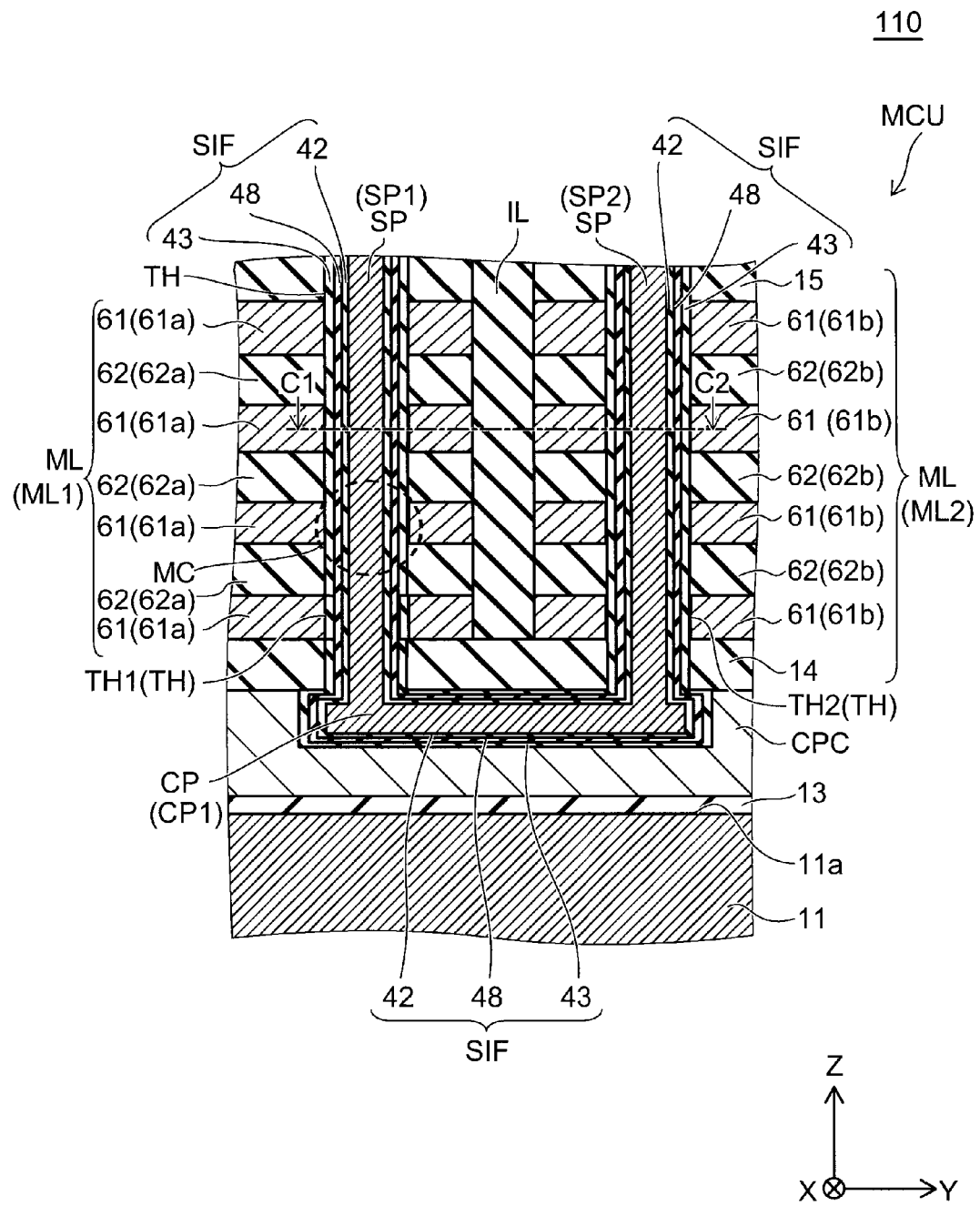
FIG. 2 is a schematic cross-sectional view illustrating the configuration of the nonvolatile semiconductor memory device according to the embodiment.

FIG. 2 is a schematic cross-sectional view illustrating the configuration of the nonvolatile semiconductor memory device according to the embodiment.

FIG. 2 illustrates a portion of the cross section along line A1-A2 of FIG. 1.

As illustrated in FIG. 2, the first stacked body ML1 includes the multiple first electrode films 61a stacked along the Z axis and a first inter-electrode insulating film 62a provided between two first electrode films 61a mutually adjacent along the Z axis. A first through-hole TH1 extending along the Z axis is provided in the first stacked body ML1. The first semiconductor pillar SP1 is filled into the first through-hole TH1 and extends along the Z axis.

The second stacked body ML2 is juxtaposed with the first stacked body ML1 along, for example, the Y axis. The second stacked body ML2 includes the multiple second electrode films 61b stacked along the Z axis and a second inter-electrode insulating film 62b provided between two second electrode films 61b mutually adjacent along the Z axis. A second through-hole TH2 extending along the Z axis is provided in the second stacked body ML1. The second semiconductor pillar SP2 is filled into the second through-hole TH2 and extends along the Z axis.

A memory film SIF is provided between the first semiconductor pillar SP1 and the multiple first electrode films 61a and between the second semiconductor pillar SP2 and the multiple second electrode films 61b. The memory film SIF is provided around the side surface of the semiconductor pillars SP along the Z axis. The memory film SIF extends between the connection portion CP (e.g., the first connection portion CP1) and the connection portion conductive layer CPC.

For example, the memory film SIF includes a charge retaining film 48, an inner insulating film 42, and an outer insulating film 43. The charge retaining film 48 is provided between the semiconductor pillar SP and the electrode films 61 and between the connection portion conductive layer CPC and the connection portion CP. The inner insulating film 42 is provided between the semiconductor pillar SP and the charge retaining film 48 and between the connection portion CP and the charge retaining film 48. The outer insulating film 43 is provided between the charge retaining film 48 and the electrode films 61 and between the charge retaining film 48 and the connection portion conductive layer CPC.

As illustrated in FIG. 2, a partitioning insulating layer IL is provided to partition the first stacked body ML1 from the second stacked body ML2. The partitioning insulating layer IL partitions the multiple first electrode films 61a from the multiple second electrode films 61b. The partitioning insulating layer IL has a portion extending along the X axis.

In this example as illustrated in FIG. 2, an insulating film 13 is provided between the substrate 11 and the connection portion conductive layer CPC. An inter-layer insulating film 14 is provided between the connection portion conductive layer CPC and the multiple electrode films 61. An inter-layer insulating film 15 is further provided. The multiple electrode films 61 are disposed between the inter-layer insulating film 14 and the inter-layer insulating film 15. For convenience, the inter-layer insulating films 14 and 15 are taken to be included in the stacked body ML.

The electrode films 61 and the connection portion conductive layer CPC may include, for example, polysilicon. However, the materials of the electrode films 61 and the connection portion conductive layer CPC are arbitrary in the embodiment.

An inter-electrode insulating film 62, the inner insulating film 42, the outer insulating film 43, the insulating film 13, the inter-layer insulating film 14, and the inter-layer insulating film 15 may include, for example, silicon oxide. However, the materials of the inter-electrode insulating film 62, the inner insulating film 42, the outer insulating film 43, and the inter-layer insulating films are arbitrary in the embodiment.

The charge retaining film 48 may include, for example, silicon nitride. However, the material of the charge retaining film 48 is arbitrary in the embodiment.

The charge retaining film 48 can function as a portion configured to store information by storing charge in the memory cells MC. The inner insulating film 42 can function as, for example, a tunneling insulating film. The outer insulating film 43 can function as a blocking insulating film. The memory cells MC are transistors having, for example, MONOS configurations. The multiple electrode films 61 can function as word electrodes.

Figure 3:
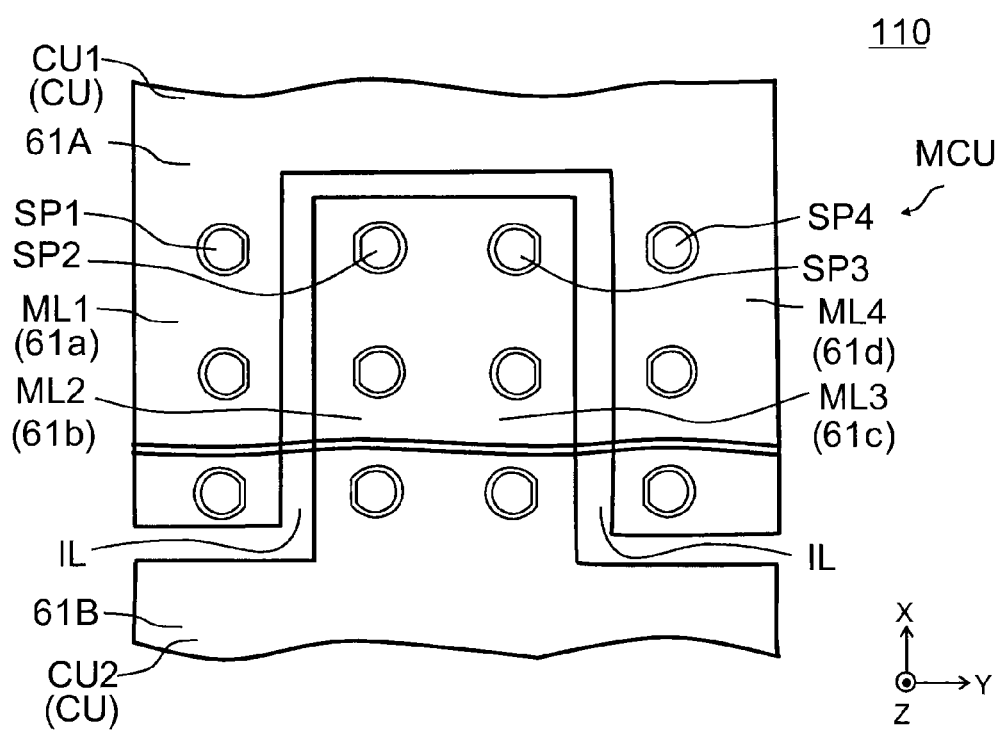
FIG. 3 is a schematic plan view illustrating the configuration of the nonvolatile semiconductor memory device according to the embodiment.

FIG. 3 is a schematic plan view illustrating the configuration of the nonvolatile semiconductor memory device according to the embodiment.

Although three semiconductor pillars SP juxtaposed along the X axis for one of the electrode films 61 are illustrated for easier viewing of the drawing in FIG. 3, the number of the semiconductor pillars SP juxtaposed along the X axis is arbitrary in the embodiment.

As illustrated in FIG. 3, for example, the first electrode film 61a of the first stacked body ML1 pierced by the first semiconductor pillar SP1 is connected to a fourth electrode film 61d of the fourth stacked body ML4 pierced by the fourth semiconductor pillar SP4 at one X-axis end (e.g., a first contact portion CU1). The connected first electrode film 61a and fourth electrode film 61d form a first linked electrode film 61A.

As described above, the second electrode film 61b of the second stacked body ML2 pierced by the second semiconductor pillar SP2 is connected to a third electrode film 61c of the third stacked body ML3 pierced by the third semiconductor pillar SP3. However, the second electrode film 61b and the third electrode film 61c may be connected at the other X-axis end (a second contact portion CU2). The connected second electrode film 61b and third electrode film 61c form a second linked electrode film 61B.

Figure 4:
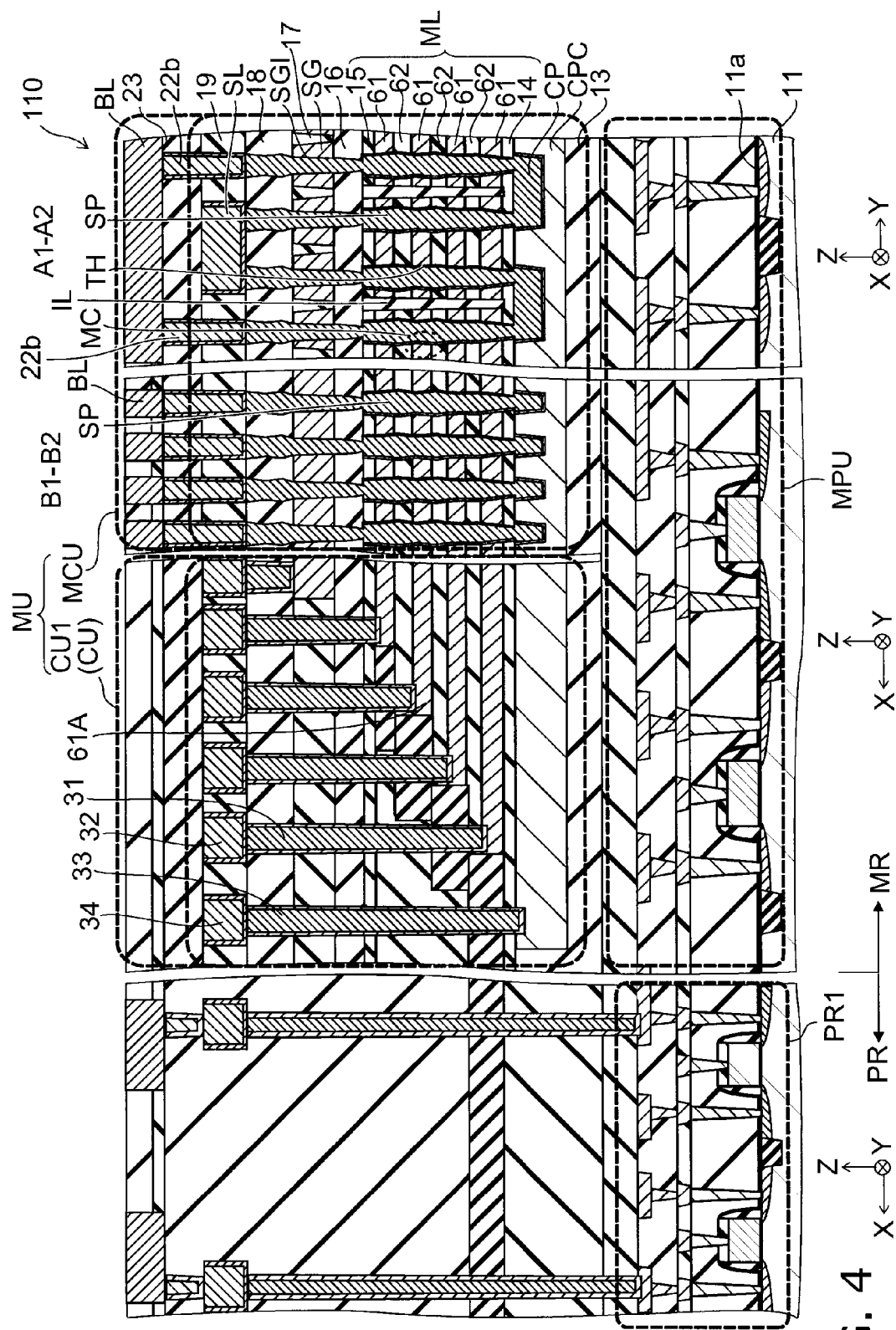
FIG. 4 is a schematic cross-sectional view illustrating the configuration of the nonvolatile semiconductor memory device according to the embodiment.

FIG. 4 is a schematic cross-sectional view illustrating the configuration of the nonvolatile semiconductor memory device according to the embodiment.

Regarding the memory cell array unit MCU, a cross section corresponding to line A1-A2 of FIG. 1 and a cross section corresponding to line B1-B2 of FIG. 1 are illustrated in FIG. 4. The first contact portions CU1 are illustrated in FIG. 4.

Although the case is illustrated where the number of the electrode films 61 is four for easier viewing of the drawing in FIG. 4, the number of the electrode films 61 is arbitrary in the embodiment.

As illustrated in FIG. 4, for example, a memory region MR and a peripheral region PR are provided in the substrate 11. The peripheral region PR is juxtaposed with the memory region MR on the major surface 11a. A peripheral circuit PR1 configured to operate the memory cells MC, for example, is provided in the peripheral region PR.

A memory unit MU and a memory unit peripheral circuit unit MPU, for example, are provided in the memory region MR. For example, the memory unit peripheral circuit unit MPU is provided on the major surface 11a of the substrate 11; and the memory unit MU is provided on the memory unit peripheral circuit unit MPU.

For example, the memory cell array unit MCU and the contact portions CU (e.g., the first contact portions CU1, etc.) are provided in the memory unit MU. The contact portions CU are juxtaposed with the memory cell array unit MCU in the X-Y plane.

As illustrated in FIG. 4, the stacked bodies ML are provided on the connection portion conductive layer CPC on the major surface 11a in the memory cell array unit MCU. The multiple selection gate electrodes SG are provided on the stacked bodies ML. An inter-layer insulating film 17 is provided between the multiple selection gate electrodes SG. In this specific example, an inter-layer insulating film 16 is provided between the inter-layer insulating film 15 and the selection gate electrodes SG. At least one selected from the inter-layer insulating film 15 and the inter-layer insulating film 16 may be omitted.

A selection gate insulating film SGI is provided between the selection gate electrodes SG and the semiconductor pillars SP. Selection gate transistors are formed at the intersections between the multiple selection gate electrodes SG and the multiple semiconductor pillars SP.

The portion of the semiconductor pillar SP piercing the stacked body ML and the portion of the semiconductor pillar SP piercing the selection gate electrode SG may be formed collectively or may be formed in different processes.

An inter-layer insulating film 18 is provided between the source lines SL and the selection gate electrodes SG. An inter-layer insulating film 23 is provided between the source lines SL and the bit lines BL. The contact vias 22a and 22b pierce the inter-layer insulating film 23 along the Z axis.

The selection gate electrodes SG may include, for example, polysilicon. The selection gate insulating film SGI may include, for example, silicon oxide. The selection gate insulating film SGI may include a material used to form at least a portion of the inner insulating film 42, the charge retaining film 48, and the outer insulating film 43.

The inter-layer insulating film 16, the inter-layer insulating film 17, the inter-layer insulating film 18, and the inter-layer insulating film 23 may include, for example, silicon oxide.

The source line SL, the bit line BL, and the contact vias 22a and 22b may include, for example, a metal material, etc. However, the source line SL, the bit line BL, and the contact vias 22a and 22b may include any conductive material.

At the first contact portions CU1, the lengths along the X axis of the stacked multiple first electrode films 61a (the first linked electrode films 61A) change in a stairstep configuration. The contact electrodes 31 are connected to the multiple first electrode films 61a (the first linked electrode films 61A) respectively. The contact electrodes 31 extend along the Z axis. The contact electrodes 31 connect the multiple first electrode films 61a (the first linked electrode films 61A) to word interconnects 32 respectively.

Although not illustrated, at the second contact portions CU2 as well, the lengths along the X axis of the stacked multiple electrode films 61 (the second linked electrode films 61B) change, for example, in a stairstep configuration. The contact electrodes 31 are connected to the stacked multiple electrode films 61 (the second linked electrode films 61B) respectively.

As illustrated in FIG. 4, the connection portion conductive layer CPC is connected to a back gate interconnect 34 by a contact electrode 33.

Figure 5:
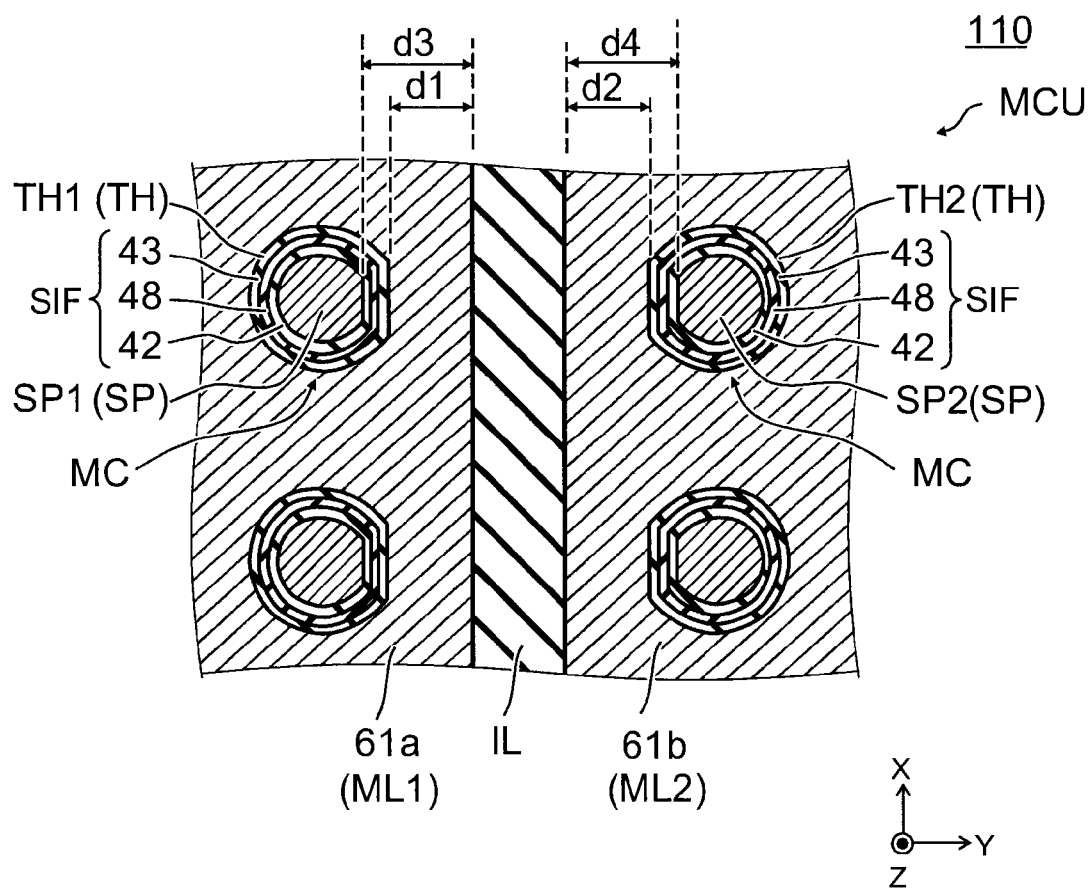
FIG. 5 is a schematic cross-sectional view illustrating the configuration of a portion of the nonvolatile semiconductor memory device according to the embodiment.

FIG. 5 is a schematic cross-sectional view illustrating the configuration of a portion of the nonvolatile semiconductor memory device according to the embodiment.

Namely, FIG. 5 illustrates the configuration of the memory cell array unit MCU of the nonvolatile semiconductor memory device 110. FIG. 5 is a cross-sectional view along line C1-C2 of FIG. 2.

As illustrated in FIG. 5, the partitioning insulating layer IL is provided between the first stacked body ML1 (i.e., the first electrode films 61a) and the second stacked body ML2 (i.e., the second electrode films 61b).

The first through-hole TH1 extending along the Z axis is provided in the first stacked body ML1. The first semiconductor pillar SP1 is provided inside the first through-hole TH1. Similarly, the second through-hole TH2 extending along the Z axis is provided in the second stacked body ML2. The second semiconductor pillar SP2 is provided inside the second through-hole TH2. The memory film SIF is provided between the first semiconductor pillar SP1 and the first electrode films 61a and between the second semiconductor pillar SP2 and the second electrode films 61b.

As illustrated in FIG. 5, the side surface of the first through-hole TH1 on the partitioning insulating layer IL side has a portion parallel to a plane (the X-Z plane) that includes the X axis and the Z axis. The side surface of the second through-hole TH2 on the partitioning insulating layer IL side has a portion parallel to the plane (the X-Z plane) that includes the X axis and the Z axis.

The embodiment is not limited thereto. As described below, at least one selected from the side surface of the first through-hole TH1 on the partitioning insulating layer IL side and the side surface of the second through-hole TH2 on the partitioning insulating layer IL side may have a portion parallel to the X-Z plane.

As illustrated in FIG. 5, the side surface of the memory film SIF on the partitioning insulating layer IL side has a portion parallel to the X-Z plane. For example, at least one selected from the side surface of the outer insulating film 43 on the partitioning insulating layer IL side, the side surface of the charge retaining film 48 on the partitioning insulating layer IL side, and the side surface of the inner insulating film 42 on the partitioning insulating layer IL side may have a portion parallel to the X-Z plane.

For example, at least one selected from the side surface of the first semiconductor pillar SP1 on the partitioning insulating layer IL side and the side surface of the second semiconductor pillar SP2 on the partitioning insulating layer IL side may have a portion parallel to the X-Z plane.

On the other hand, the side surface of the first through-hole TH1 on the side opposite to the partitioning insulating layer IL and the side surface of the second through-hole TH2 on the side opposite to the partitioning insulating layer IL have curved configurations parallel to the Z axis (e.g., portions of cylindrical configurations extending along the Z axis).

Specifically, the side surface of the first through-hole TH1 on the side opposite to the partitioning insulating layer IL has a protruding configuration protruding in the direction from the partitioning insulating layer IL toward the first through-hole TH1. The side surface of the second through-hole TH2 on the side opposite to the partitioning insulating layer IL has a protruding configuration protruding in the direction from the partitioning insulating layer IL toward the second through-hole TH2.

For example, the configuration of the side surface of the memory film SIF on the side opposite to the partitioning insulating layer IL is a curved surface parallel to the Z axis.

For example, the curvature of the portion of the inner insulating film 42 on the side opposite to the partitioning insulating layer IL is larger than the curvature of the portion of the outer insulating film 43 on the side opposite to the partitioning insulating layer IL. Thereby, the electric field of the portion of the inner insulating film 42 on the side opposite to the partitioning insulating layer IL can be greater than the electric field of the portion of the outer insulating film 43 on the side opposite to the partitioning insulating layer IL. Thereby, the operations stabilize.

As illustrated in FIG. 5, a distance (a first distance d1) along the Y axis between the partitioning insulating layer IL and the ends of the multiple first electrode films 61a on the partitioning insulating layer IL side is substantially the same as a distance (a second distance d2) along the Y axis between the partitioning insulating layer IL and the ends of the multiple second electrode films 61b on the partitioning insulating layer IL side.

For example, a distance (a third distance d3) along the Y axis between the partitioning insulating layer IL and the end of the first semiconductor pillar SP1 on the partitioning insulating layer IL side is substantially the same as a distance (a fourth distance d4) along the Y axis between the partitioning insulating layer IL and the ends of the multiple second semiconductor pillars SP2 on the partitioning insulating layer IL side.

The memory film SIF is formed on the interior wall surface of the through-hole TH; and the semiconductor pillar SP is formed by filling a semiconductor material into the remaining space. Therefore, the configuration of the memory film SIF cut by the X-Y plane reflects the configuration of the through-hole TH cut by the X-Y plane. The thickness of the memory film SIF is, for example, uniform. Therefore, the configuration of the semiconductor pillar SP cut by the X-Y plane reflects the configuration of the through-hole TH cut by the X-Y plane.

As described below, the through-holes TH are formed by, for example, patterning using a sidewall mask layer provided on the sidewalls of a portion of the partitioning insulating layer IL as a mask. The distance between the partitioning insulating layer IL and the wall surfaces of the through-holes TH is constant because the thickness of the sidewall mask layer is constant.

Therefore, in the embodiment, for example, the design margin for the shift of the positional alignment of the photomask for the patterning can be omitted. Thereby, the distance from the partitioning insulating layer IL to the through-holes TH can be reduced. In other words, the spacing between the memory cells MC can be reduced. Thereby, the size per memory cell MC can be reduced further. According to the embodiment, a nonvolatile semiconductor memory device having a higher storage density can be provided.

An example of a method for manufacturing the nonvolatile semiconductor memory device 110 will now be described.

FIG. 6A to FIG. 6C, FIG. 7A to FIG. 7C, FIG. 8A to FIG. 8C, FIG. 9A to FIG. 9C, FIG. 10A to FIG. 10C, FIG. 11A to FIG. 11C, FIG. 12A to FIG. 12C, FIG. 13A to FIG. 13C, and FIG. 14A to FIG. 14C are schematic views in order of the processes, illustrating the method for manufacturing the nonvolatile semiconductor memory device according to the embodiment.

These drawings correspond to the memory cell array unit MCU.

FIG. 6A, FIG. 7A, FIG. 8A, FIG. 9A, FIG. 10A, FIG. 11A, FIG. 12A, FIG. 13A, and FIG. 14A are schematic plan views.

FIG. 6B, FIG. 7B, FIG. 8B, FIG. 9B, FIG. 10B, FIG. 11B, FIG. 12B, FIG. 13B, and FIG. 14B are cross-sectional views along line B1-B2 of FIG. 6A, FIG. 7A, FIG. 8A, FIG. 9A, FIG. 10A, FIG. 11A, FIG. 12A, FIG. 13A, and FIG. 14A, respectively.

FIG. 6C, FIG. 7C, FIG. 8C, FIG. 9C, FIG. 10C, FIG. 11C, FIG. 12C, FIG. 13C, and FIG. 14C are cross-sectional views along line A1-A2 of FIG. 6A, FIG. 7A, FIG. 8A, FIG. 9A, FIG. 10A, FIG. 11A, FIG. 12A, FIG. 13A, and FIG. 14A, respectively.

Figure 6A:
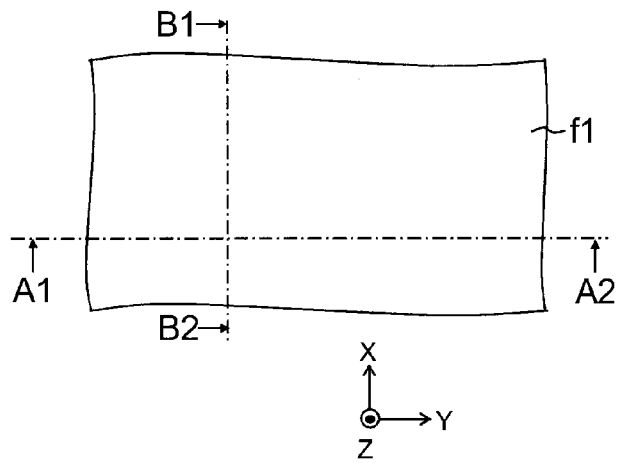
FIG. 6A to FIG. 6C are schematic views in order of the processes, illustrating the method for manufacturing the nonvolatile semiconductor memory device according to the embodiment.
Figure 6B:
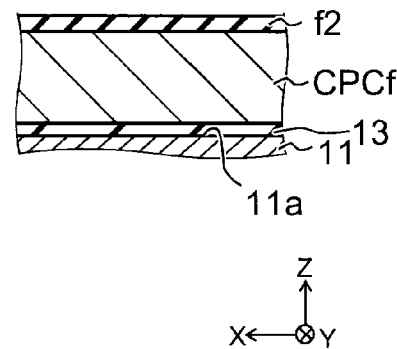
Figure 6C:
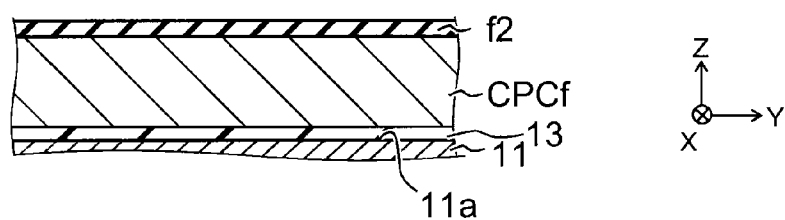

As illustrated in FIG. 6A to FIG. 6C, the insulating film 13 is formed on the major surface 11a of the substrate 11 (e.g., a silicon substrate). If necessary, the peripheral circuit PR1 and the memory unit peripheral circuit unit MPU may be formed on the major surface 11a of the substrate 11; and the insulating film 13 may be formed thereon.

A connection portion conductive film CPCf used to form the connection portion conductive layer CPC is formed on the insulating film 13. In other words, for example, a polysilicon film used to form the connection portion conductive film CPCf is formed. An insulating film f2 is formed on the connection portion conductive film CPCf. The insulating film f2 functions as a stopper film of CPM.

Figure 7A:
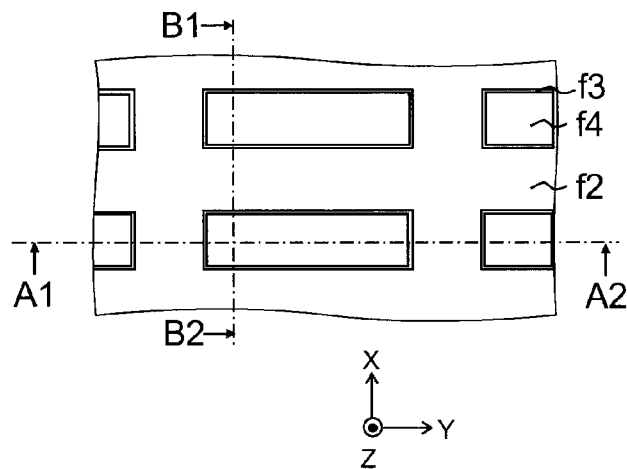
FIG. 7A to FIG. 7C are schematic views in order of the processes, illustrating the method for manufacturing the nonvolatile semiconductor memory device according to the embodiment.
Figure 7B:
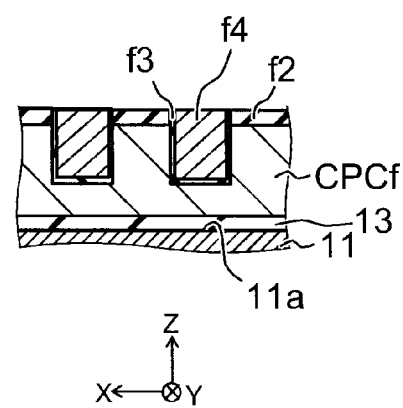
Figure 7C:
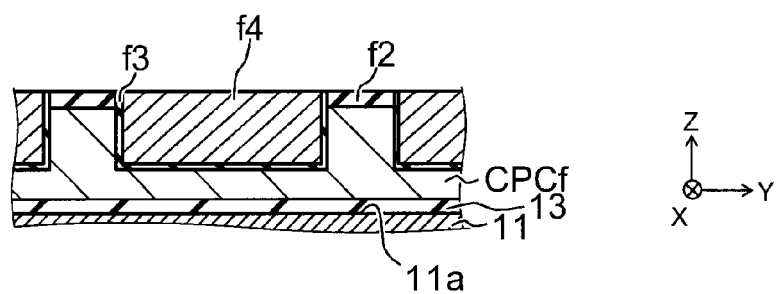

As illustrated in FIG. 7A to FIG. 7C, a first photoresist having a first pattern corresponding to the pattern of the connection portions CP is formed using photolithography; and the insulating film f2 and the connection portion conductive film CPCf are patterned using the first photoresist as a mask. For example, RIE is used in this patterning. Thereby, trenches corresponding to the pattern of the connection portions CP are made.

An insulating film f3 is formed on the front surface of the connection portion conductive film CPCf (the polysilicon film). The insulating film f3 is, for example, a silicon oxide film. For example, RTO (Rapid Thermal Oxidation) may be used to form the insulating film f3.

An amorphous silicon film f4 is formed on the front surface of the patterning body. The amorphous silicon film f4 is formed on the insulating film f3 of the interior walls inside the trenches. For example, LPCVD is used to form the amorphous silicon film f4.

The amorphous silicon film f4 is etched and planarized using, for example, RIE by using the insulating film f2 as a stopper.

Figure 8A:
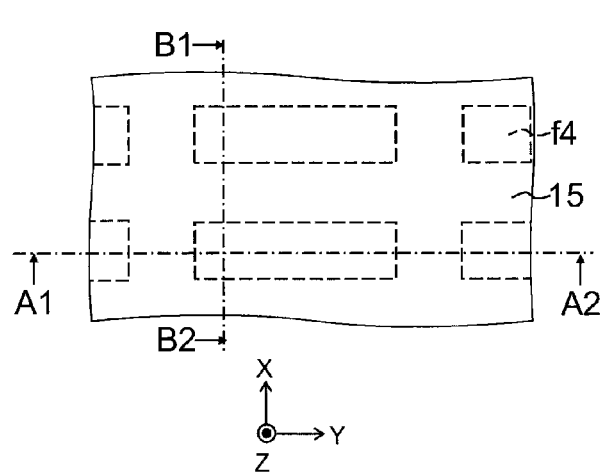
FIG. 8A to FIG. 8C are schematic views in order of the processes, illustrating the method for manufacturing the nonvolatile semiconductor memory device according to the embodiment.
Figure 8B:
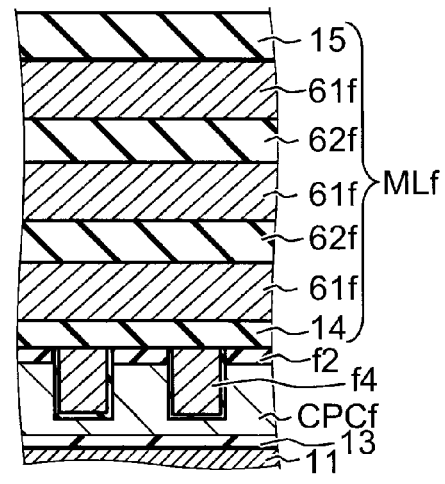
Figure 8C:
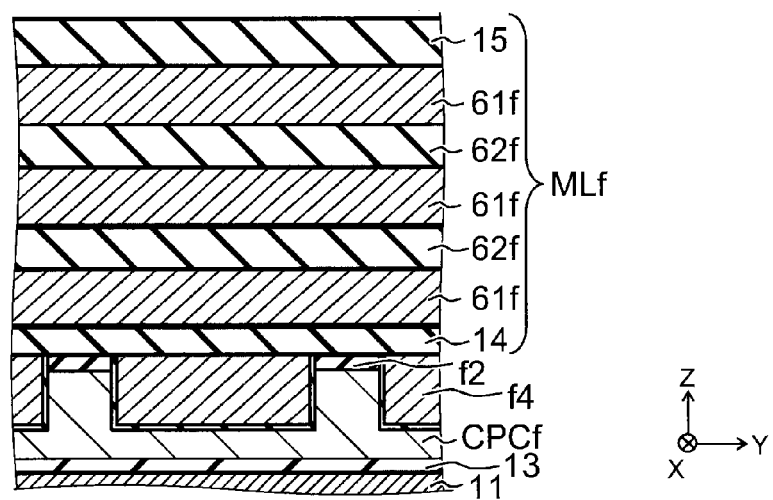

The inter-layer insulating film 14 is formed as illustrated in FIG. 8A to FIG. 8C. The inter-layer insulating film 14 may include, for example, a silicon oxide film. For example, LPCVD is used to form the inter-layer insulating film 14.

The first layers 61f are stacked alternately with second layers 62f on the inter-layer insulating film 14. The etching rate of the first layers 61f is different from the etching rate of the second layers 62f.

For example, the first layers 61f are used to form the electrode films 61; and the second layers 62f are used to form the inter-electrode insulating films 62. Or, for example, the first layers 61f are used to form the inter-electrode insulating films 62; and the second layers 62f are used to form the electrode films 61. Or, for example, the first layers 61f are used to form the electrode films 61; the second layers 62f are removed; and other layers (third layers) formed in the removed portions are used to form the inter-electrode insulating films 62. Or, for example, the second layers 62f are used to form the inter-electrode insulating films 62; the first layers 61f are removed; and other layers (third layers) formed in the removed portions are used to form the electrode films 61.

In this specific example, the first layers 61f may include, for example, amorphous silicon films doped with an impurity. For example, boron is used as the impurity. The second layers 62f may include, for example, non-doped amorphous silicon films.

Although three first layers 61f are illustrated for easier viewing of the drawings in FIG. 8B and FIG. 8C, the number of the first layers 61f is arbitrary in the embodiment.

The inter-layer insulating film 15 is formed on the stacked films of the first layers 61f and the second layers 62f. The inter-layer insulating film 15 may include a silicon oxide film. Thereby, a stacked main body MLf used to form the stacked bodies ML is formed.

Figure 9A:
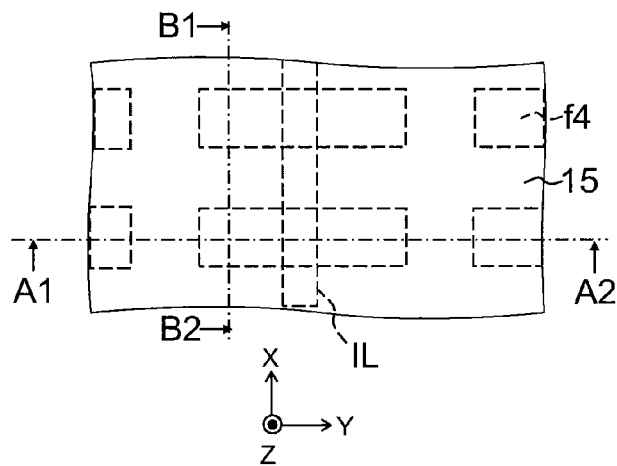
FIG. 9A to FIG. 9C are schematic views in order of the processes, illustrating the method for manufacturing the nonvolatile semiconductor memory device according to the embodiment.
Figure 9B:
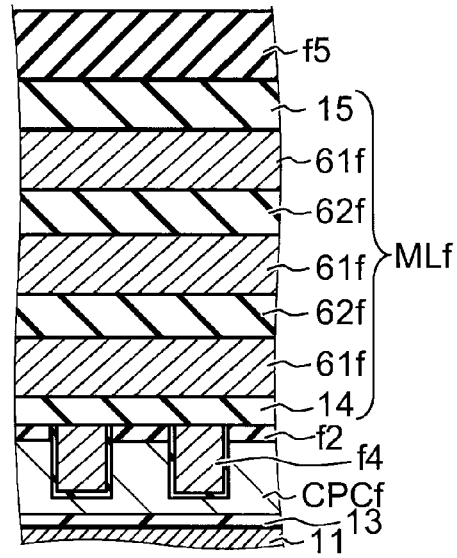
Figure 9C:
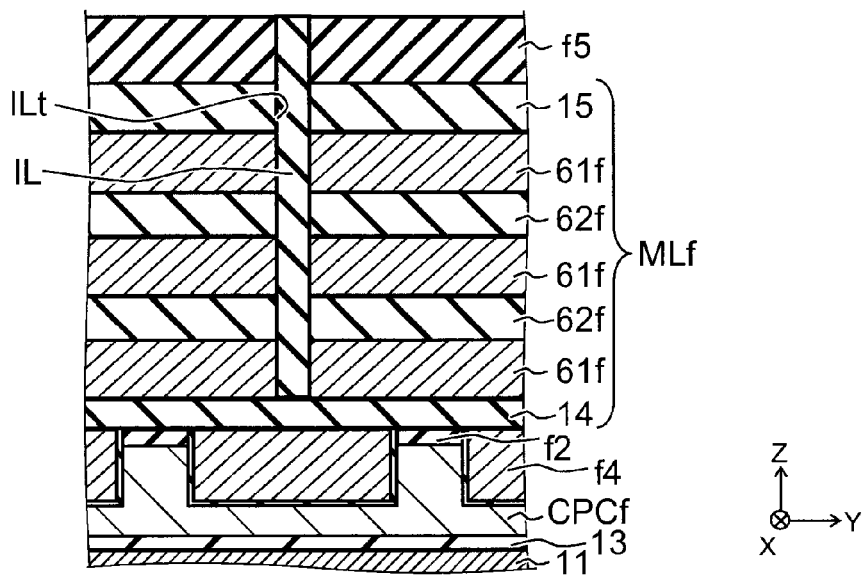

As illustrated in FIG. 9A to FIG. 9C, a boron-doped silicon oxide film f5 is formed on the inter-layer insulating film 15. The boron-doped silicon oxide film f5 is used as a mask in a subsequent process.

A second photoresist having the desired second pattern is formed on the boron-doped silicon oxide film f5 using photolithography. The second pattern is positionally aligned using, for example, the position of the first pattern (the pattern of the connection portions CP) as a reference.

The boron-doped silicon oxide film f5 is etched by RIE using the second photoresist as a mask. Subsequently, the second photoresist is removed.

Then, the stacked main body MLf is etched by RIE using the boron-doped silicon oxide film f5 as a mask. Thereby, a trench ILt is made in which the partitioning insulating layer IL is formed. The trench ILt has a configuration extending in a band configuration along the X axis.

Subsequently, a silicon oxide film is formed. The silicon oxide film is filled into the trench ILt. Then, etch-back and planarization of this silicon oxide film are performed using RIE. Thereby, the partitioning insulating layer IL is formed.

Then, the boron-doped silicon oxide film f5 is removed using, for example, VPC (hydrofluoric acid vapor).

Figure 10A:
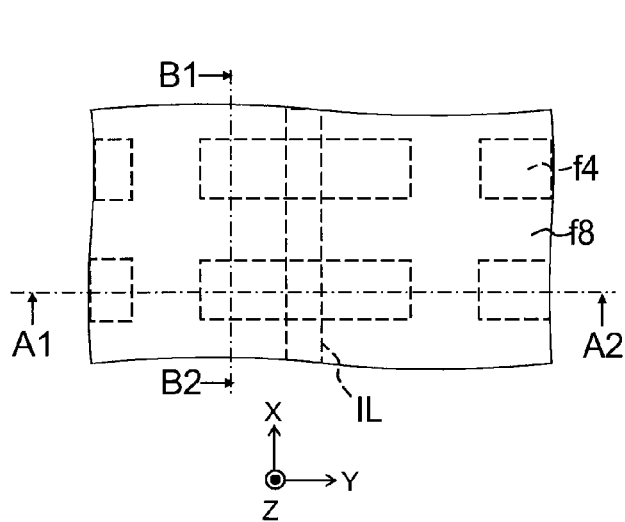
FIG. 10A to FIG. 10C are schematic views in order of the processes, illustrating the method for manufacturing the nonvolatile semiconductor memory device according to the embodiment.
Figure 10B:
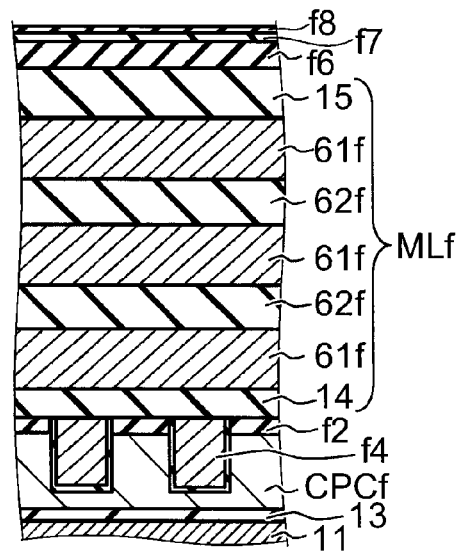
Figure 10C:
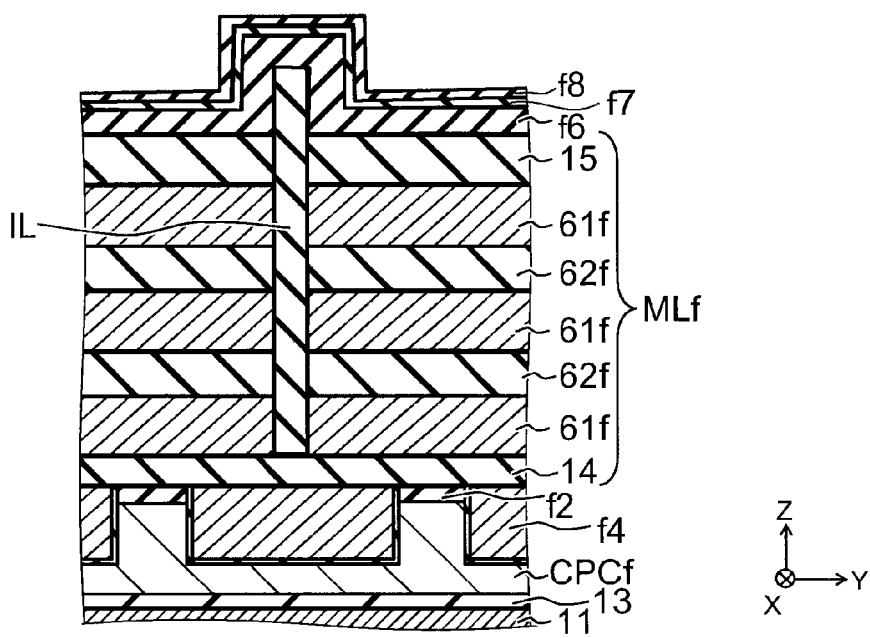

As illustrated in FIG. 10A to FIG. 10C, an insulating film f6 is formed on the front surface of the patterning body. The insulating film f6 may include, for example, a silicon oxide film. For example, PLCVD is used to form the insulating film f6.

Then, a carbon film f7 is formed. An insulating film f8 is formed on the carbon film f7. The insulating film f8 may include, for example, a silicon oxide film. For example, coating or CVD is used to form the carbon film f7 and the insulating film f8.

Figure 11A:
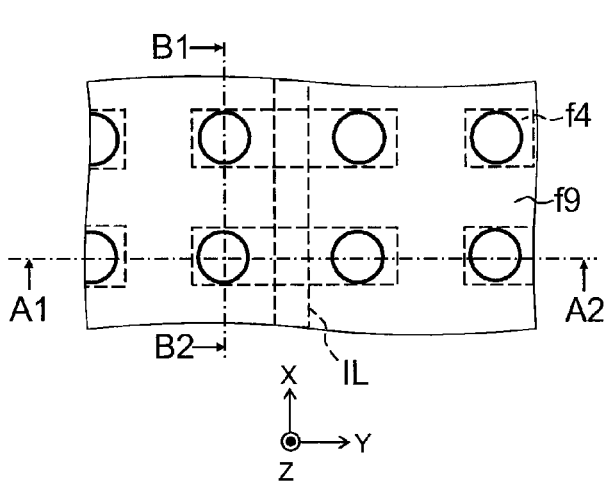
FIG. 11A to FIG. 11C are schematic views in order of the processes, illustrating the method for manufacturing the nonvolatile semiconductor memory device according to the embodiment.
Figure 11B:
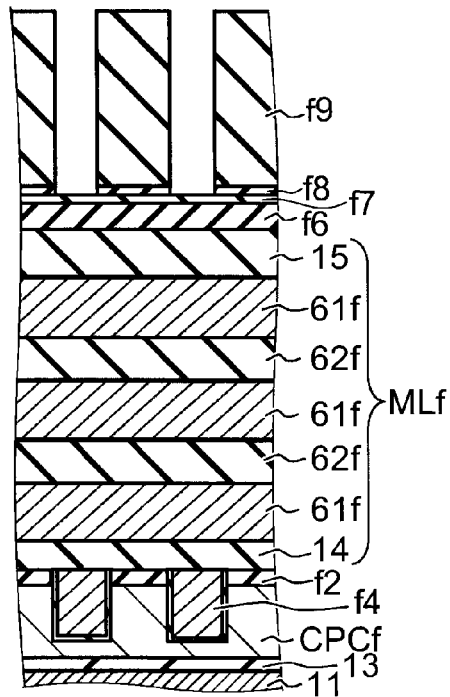
Figure 11C:
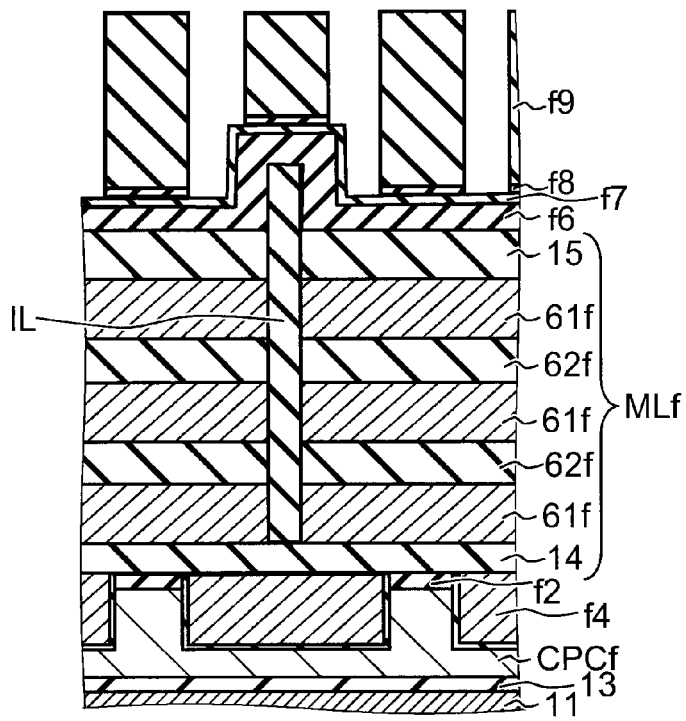

As illustrated in FIG. 11A to FIG. 11C, a third photoresist f9 having a third pattern is formed using photolithography. The third pattern is positionally aligned using, for example, the position of the first pattern (the pattern of the connection portions CP) as a reference.

The insulating film f8 is etched by, for example, RIE using the third photoresist f9 as a mask.

Subsequently the third photoresist f9 is removed.

Figure 12A:
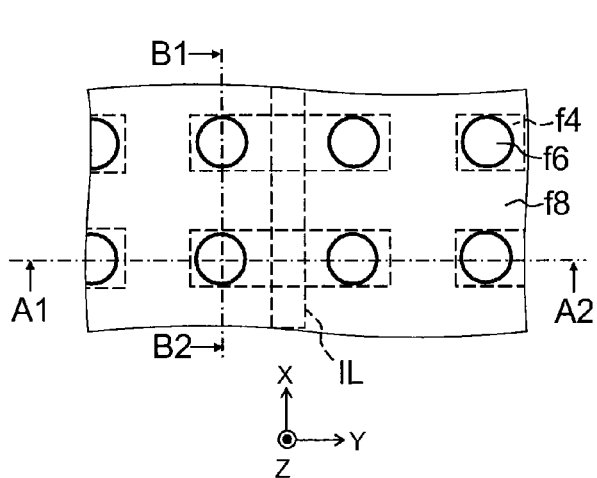
FIG. 12A to FIG. 12C are schematic views in order of the processes, illustrating the method for manufacturing the nonvolatile semiconductor memory device according to the embodiment.
Figure 12B:
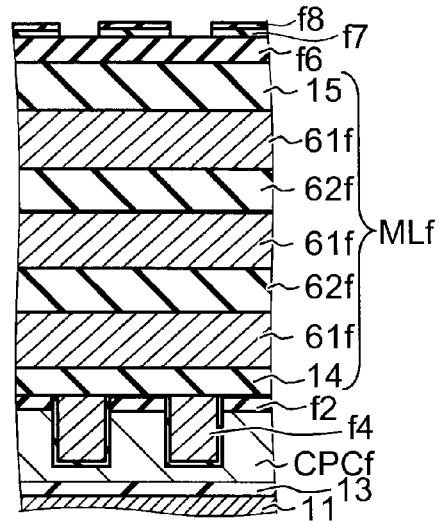
Figure 12C:
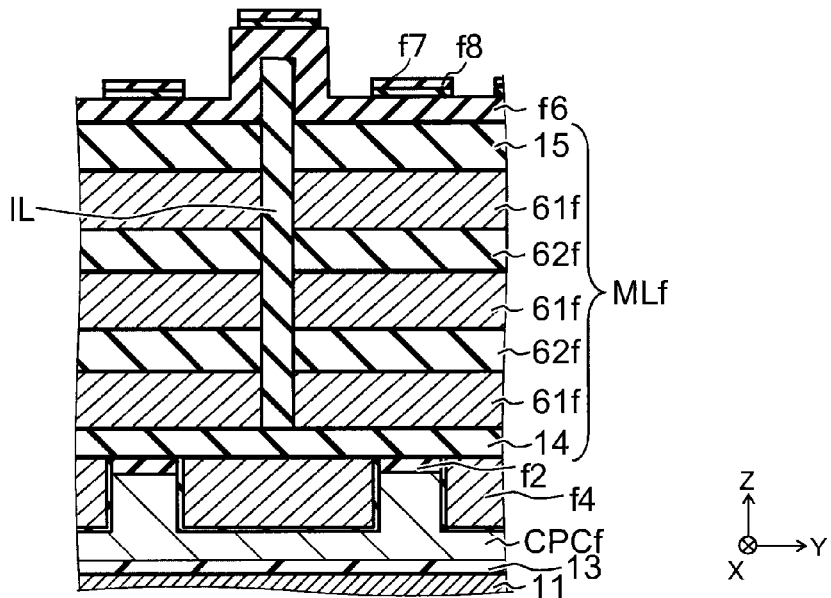

As illustrated in FIG. 12A to FIG. 12C, the carbon film f7 is etched by, for example, RIE using the insulating film f8 as a mask material.

Figure 13A:
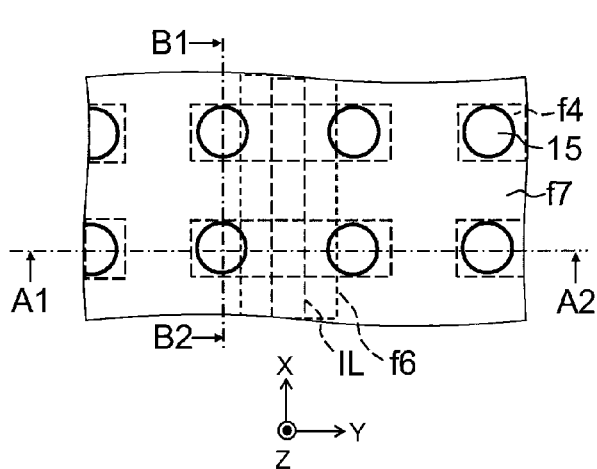
FIG. 13A to FIG. 13C are schematic views in order of the processes, illustrating the method for manufacturing the nonvolatile semiconductor memory device according to the embodiment.
Figure 13B:
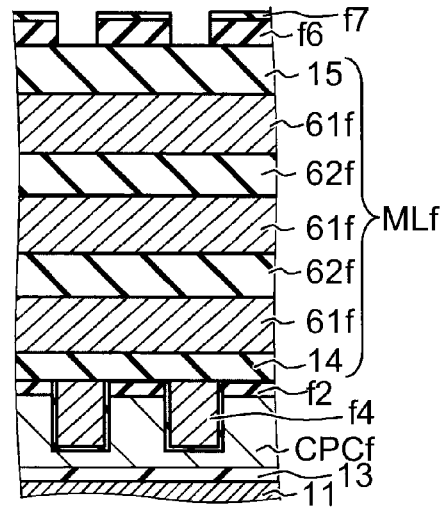
Figure 13C:
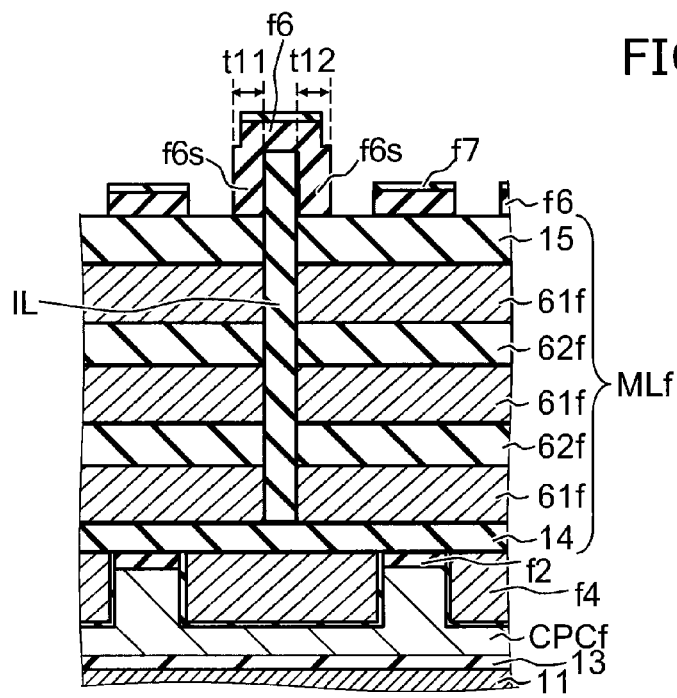

As illustrated in FIG. 13A to FIG. 13C, the insulating film f6 is etched by, for example, RIE using the carbon film f7 as a mask.

At this time, as illustrated in FIG. 13C, the insulating film f6 remains on the sidewalls of the partitioning insulating layer IL. Thus, a sidewall mask layer f6s is formed on the sidewalls of a portion of the partitioning insulating layer IL. The thicknesses (a thickness t11 and a thickness t12) along the Y axis of the insulating film f6 (the sidewall mask layer f6s) remaining on the sidewalls of the partitioning insulating layer IL reflect, for example, the thickness of the insulating film f6.

Thus, the formation of the sidewall mask layer f6s includes forming a sacrificial layer to cover the upper portion of the partitioning insulating layer IL and removing the sacrificial layer except for the portions opposing the sidewalls of the partitioning insulating layer IL.

Figure 14A:
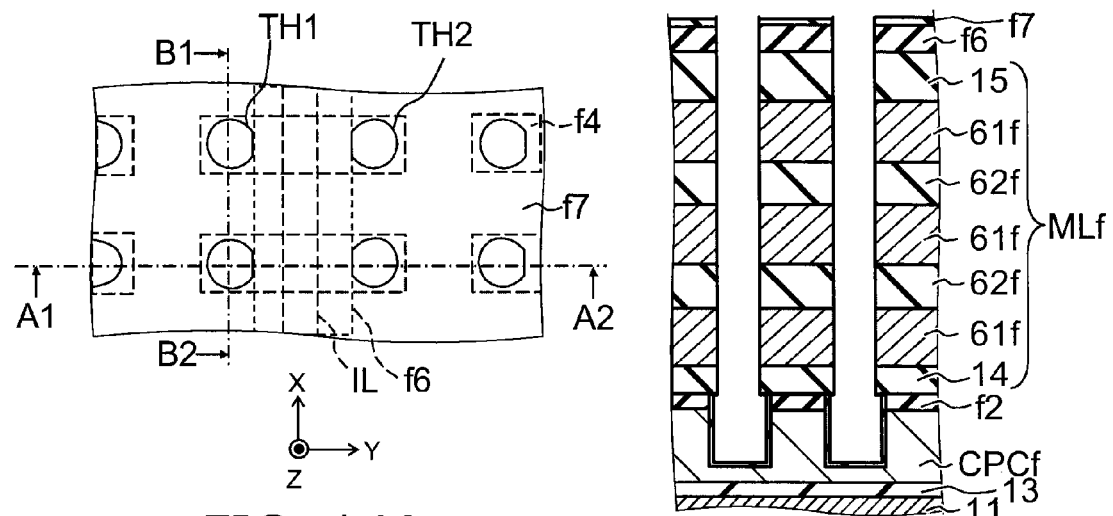
FIG. 14A to FIG. 14C are schematic views in order of the processes, illustrating the method for manufacturing the nonvolatile semiconductor memory device according to the embodiment.
Figure 14B:
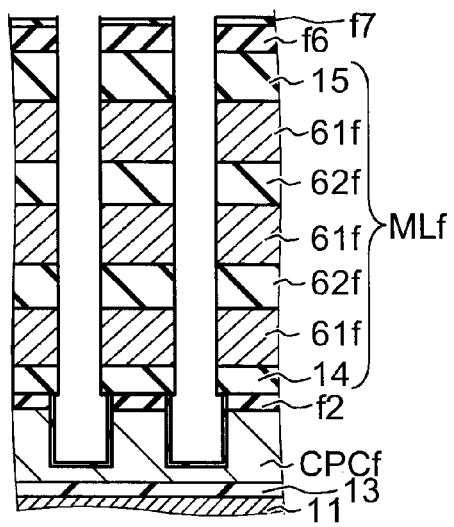
Figure 14C:
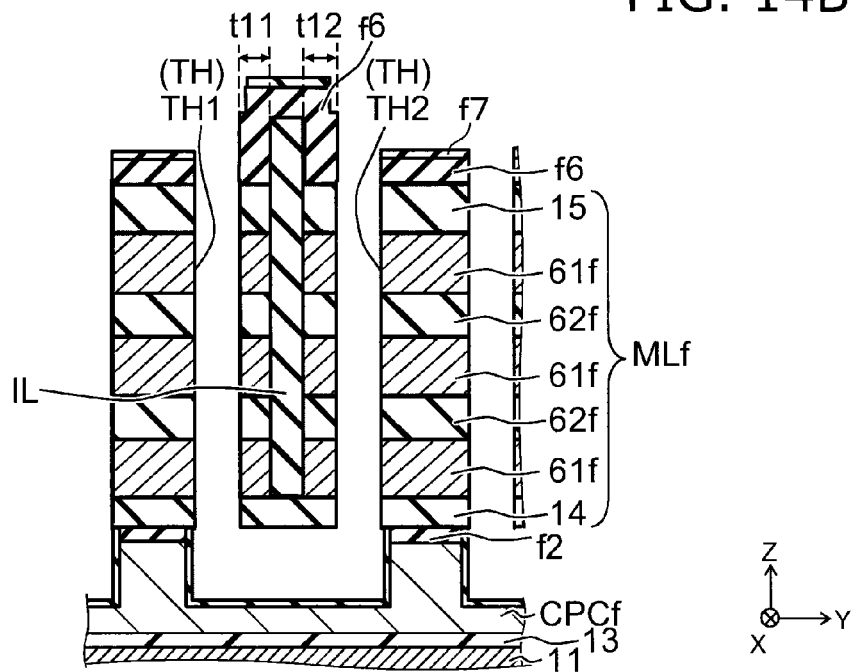

As illustrated in FIG. 14A to FIG. 14C, the stacked main body MLf is etched by, for example, RIE using the carbon film f7 and the insulating film f6 as a mask. Thereby, the through-holes TH (the first through-hole TH1 and the second through-hole TH2, etc.) are made in the stacked main body MLf.

Subsequently, the second layers 62f are removed, for example, via the through-holes TH1. At this time, the amorphous silicon film f4 also is removed.

Then, for example, a silicon oxide film is filled into the locations where the second layers 62f existed. This silicon oxide film is used to form the inter-electrode insulating films 62. Continuing, the first layers 61f are used to form the electrode films 61. The silicon oxide film formed at this time can be considered to be at least a portion of the memory film SIF of the connection portions CP.

Subsequently, for example, the outer insulating film 43, the charge retaining film 48, and the inner insulating film 42 are formed sequentially inside the through-holes TH.

Thereby, the memory film SIF is formed.

Then, a semiconductor material is filled into the remaining space of the through-holes TH. Thereby, the semiconductor pillars SP and the connection portions CP are formed.

Thus, the method for manufacturing further includes forming the memory film SIF inside the first through-hole TH1 and the second through-hole TH2 and forming the first semiconductor pillar and the second semiconductor pillar by filling a semiconductor into the remaining space inside the first through-hole TH1 and the second through-hole TH2.

Subsequently, the selection gate electrodes SG, various interconnects, and various inter-layer insulating films are formed; and the nonvolatile semiconductor memory device 110 is formed.

Figure 15:
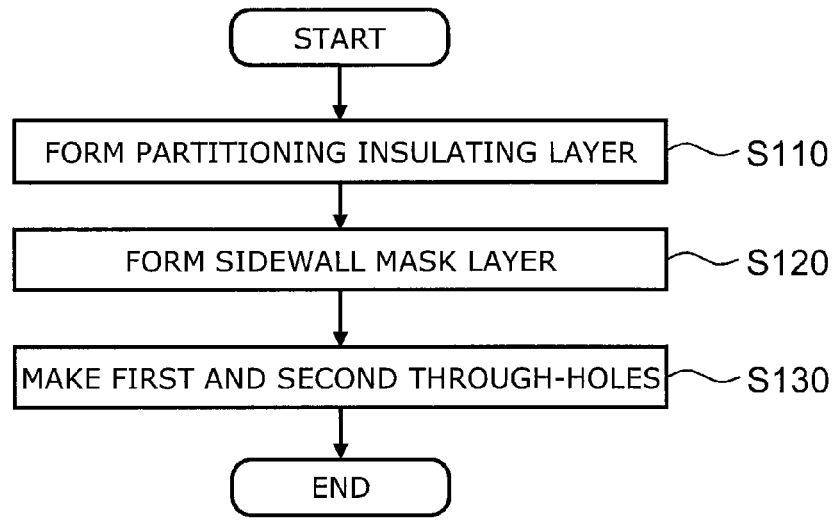
FIG. 15 is a flowchart illustrating the method for manufacturing the nonvolatile semiconductor memory device according to the embodiment.

FIG. 15 is a flowchart illustrating the method for manufacturing the nonvolatile semiconductor memory device according to the embodiment.

This manufacturing method is a method for manufacturing a nonvolatile semiconductor memory device (e.g., the nonvolatile semiconductor memory device 110), the device including: the first stacked body ML1 including the multiple first electrode films 61a stacked along the first axis and the first inter-electrode insulating film 62a provided between two first electrode films 61a mutually adjacent along the first axis, the first through-hole TH1 being provided in the first stacked body ML1 to extend along the Z axis; the first semiconductor pillar SP1 filled into the first through-hole TH1 to extend along the Z axis; the second stacked body ML2 juxtaposed with the first stacked body ML1 along the Y axis orthogonal to the Z axis, the second stacked body ML2 including the multiple second electrode films 61b stacked along the Z axis and the second inter-electrode insulating film 62b provided between two second electrode films 61b mutually adjacent along the Z axis, the second through-hole TH2 being provided in the second stacked body ML2 to extend along the Z axis; the second semiconductor pillar SP2 filled into the second through-hole TH2 to extend along the Z axis; the connection portion CP electrically connecting the first semiconductor pillar SP1 to the second semiconductor pillar SP2; the memory film provided between the first semiconductor pillar SP1 and the multiple first electrode films 61a and between the second semiconductor pillar SP2 and the multiple second electrode films 61b; and the partitioning insulating layer IL provided between the first stacked body ML1 and the second stacked body ML2 to partition the multiple first electrode films 61a from the multiple second electrode films 61b.

As illustrated in FIG. 15, the partitioning insulating layer IL is formed in the stacked main body MLf used to form the first stacked body ML1 and the second stacked body ML2 (step S110). In other words, the processing described in regard to, for example, FIG. 9A to FIG. 9C is implemented.

Then, the sidewall mask layer f6s is formed on the sidewalls of a portion of the partitioning insulating layer IL (step S120). In other words, the processing described in regard to, for example, FIG. 13A to FIG. 13C is implemented.

Continuing, the first through-hole TH1 and the second through-hole TH2 are made in the stacked main body MLf by using the sidewall mask layer f6s as a portion of a mask (step S130). In other words, the processing described in regard to, for example, FIG. 14A to FIG. 14C is implemented.

Thus, in the manufacturing method, the through-holes TH are made by patterning using the sidewall mask layer f6s provided on the sidewalls of a portion of the partitioning insulating layer IL as a mask. The thickness of the sidewall mask layer f6s is substantially the same as, for example, the thickness of the insulating film f6.

The thickness t11 along the Y axis of the sidewall mask layer f6s on the first through-hole TH1 side illustrated in FIG. 14C is substantially the same as the first distance d1 illustrated in FIG. 5. Also, the thickness t12 along the Y axis of the sidewall mask layer f6s on the second through-hole TH2 side is substantially the same as the second distance d2 illustrated in FIG. 5.

Thus, in the nonvolatile semiconductor memory device 110 manufactured using the manufacturing method, the first distance d1 is substantially equal to the second distance d2.

In other words, in the embodiment, the through-holes TH are formed self-aligningly with respect to the partitioning insulating layer IL.

Therefore, in the nonvolatile semiconductor memory device according to the embodiment and the method for manufacturing the same, the design margin considering the shift of the positional alignment of the photomask for the patterning can be reduced. Thereby, the distance between the partitioning insulating layer IL and the through-holes TH can be reduced; and the spacing between the memory cells MC can be reduced. Thereby, the size per memory cell MC can be reduced further; and the storage density can be increased.

Figure 16:
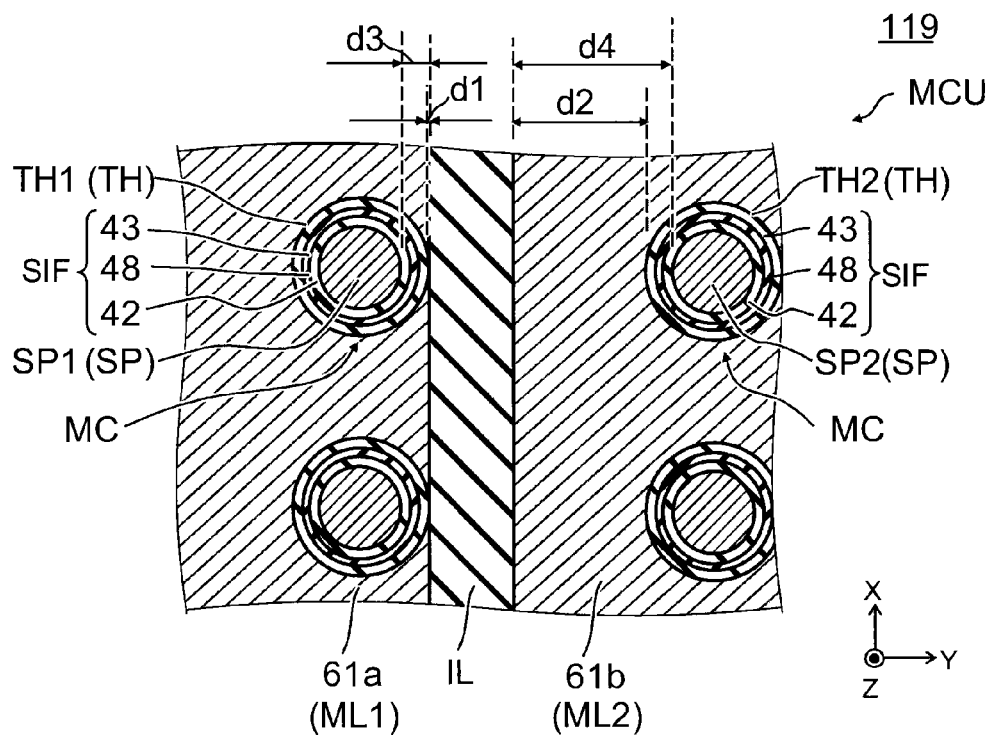
FIG. 16 is a schematic cross-sectional view illustrating the configuration of a nonvolatile semiconductor memory device of a reference example.

FIG. 16 is a schematic cross-sectional view illustrating the configuration of a nonvolatile semiconductor memory device of a reference example.

In the nonvolatile semiconductor memory device 119 of the reference example as illustrated in FIG. 16, the distance (the first distance d1) along the Y axis between the partitioning insulating layer IL and the ends of the first electrode films 61a on the partitioning insulating layer IL side is different from the distance (the second distance d2) along the Y axis between the partitioning insulating layer IL and the ends of the second electrode films 61b on the partitioning insulating layer IL side.

In such a nonvolatile semiconductor memory device 119, the sidewall mask layer f6s is not used as a portion of the mask in the process of making the first through-hole TH1 and the second through-hole TH2 in the stacked main body MLf. For example, the through-holes TH are made in the stacked main body MLf using only the mask material having the fourth pattern that has openings corresponding to the through-holes TH. In the method, the position of the fourth pattern shifts with respect to the position of the pattern of the patterning of the partitioning insulating layer IL (e.g., the second pattern). Therefore, the positions of the through-holes TH shift relative to the position of the partitioning insulating layer IL. Then, this shift causes the distance between the partitioning insulating layer IL and the through-holes TH to change.

In such a nonvolatile semiconductor memory device 119, for example, as illustrated in FIG. 16, one of the through-holes TH is too proximal to the partitioning insulating layer IL. In this example, the first through-hole TH1 is too proximal to the partitioning insulating layer IL; and the widths of the first electrode films 61a between the first through-hole TH1 and the partitioning insulating layer IL are extremely narrow. For example, there also may be cases where the first electrode films 61a between the first through-hole TH1 and the partitioning insulating layer IL are divided. Therefore, the electrical resistance of the first electrode films 61a of the portion between the first through-hole TH1 and the partitioning insulating layer IL is high. Thereby, it becomes difficult to obtain the desired electrical characteristics.

Therefore, in the reference example, it is necessary to set the distance between the first through-hole TH1 and the second through-hole TH2 to be large. In the reference example, it is difficult to sufficiently reduce the size per memory cell MC.

Conversely, in the nonvolatile semiconductor memory device 110 according to the embodiment and the method for manufacturing the same, the through-holes TH are formed self-aligningly with respect to the partitioning insulating layer IL. Thereby, the size per memory cell MC can be reduced further; and the storage density can be increased.

Figure 17A:
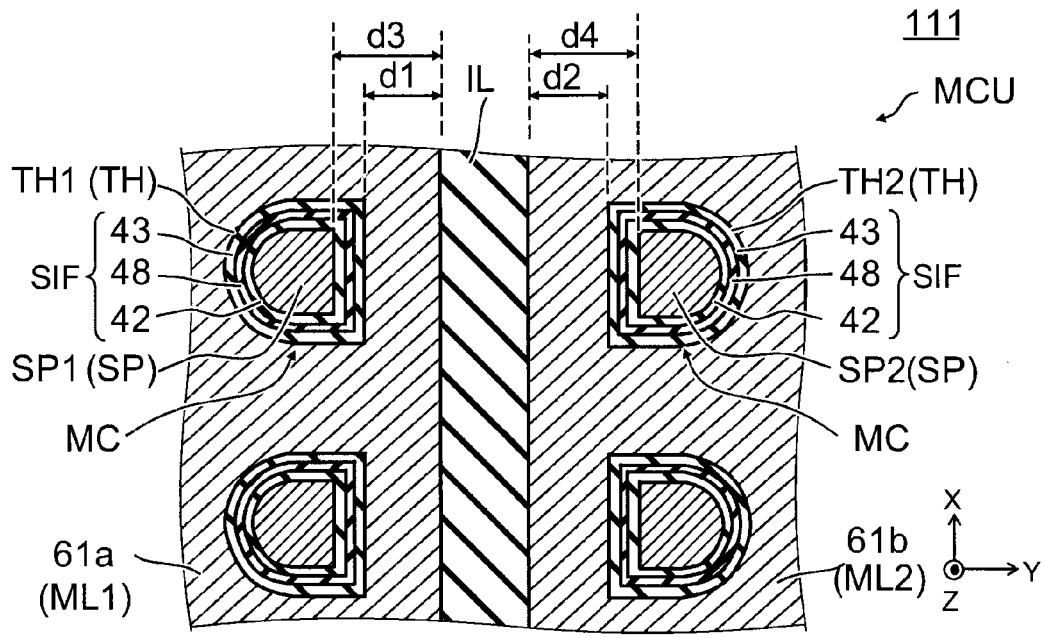
FIG. 17A and FIG. 17B are schematic cross-sectional views illustrating the configuration of another nonvolatile semiconductor memory device according to the embodiment.
Figure 17B:
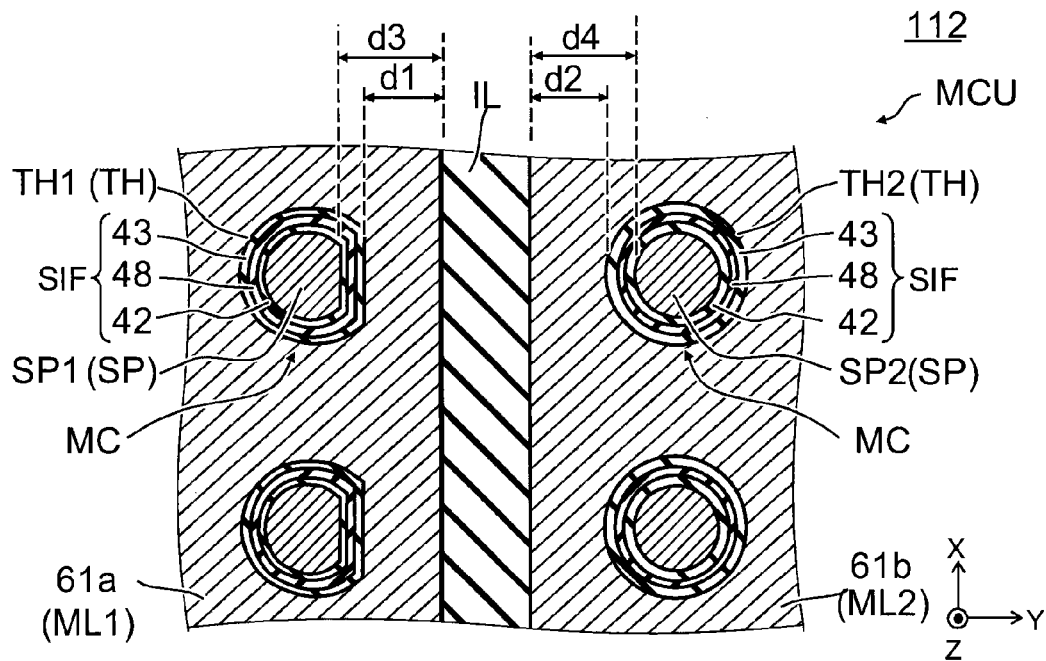

FIG. 17A and FIG. 17B are schematic cross-sectional views illustrating the configuration of another nonvolatile semiconductor memory device according to the embodiment.

In the nonvolatile semiconductor memory device 111 according to the embodiment as illustrated in FIG. 17A, the configurations of the first through-hole TH1 and the second through-hole TH2 cut by the X-Y plane are configurations in which a semicircle and a rectangle are combined.

In other words, the length along the X axis of the planar portion of the sidewall of the first through-hole TH1 on the partitioning insulating layer IL side is substantially equal to the lengths of the first through-hole TH1 along the X axis and along the Y axis. The length along the X axis of the planar portion of the sidewall of the second through-hole TH2 on the partitioning insulating layer IL side is substantially equal to the lengths of the second through-hole TH2 along the X axis and along the Y axis.

In such a case as well, the side surface of the first through-hole TH1 on the partitioning insulating layer IL side and the side surface of the second through-hole TH2 on the partitioning insulating layer IL side have portions parallel to the X-Z plane. The side surface of the first through-hole TH1 on the side opposite to the partitioning insulating layer IL and the side surface of the second through-hole TH2 on the side opposite to the partitioning insulating layer IL have curved configurations parallel to the Z axis.

The distance (the first distance d1) along the Y axis between the partitioning insulating layer IL and the ends of the first electrode films 61a on the partitioning insulating layer IL side is substantially the same as the distance (the second distance d2) along the Y axis between the partitioning insulating layer IL and the ends of the second electrode films 61b on the partitioning insulating layer IL side.

In another nonvolatile semiconductor memory device 112 according to the embodiment as illustrated in FIG. 17B, the side surface of the first through-hole TH1 on the partitioning insulating layer IL side has a portion parallel to the X-Z plane. On the other hand, the side surface of the second through-hole TH2 on the partitioning insulating layer IL side does not have a portion parallel to the X-Z plane. In other words, in this example, the configuration of the second through-hole TH2 cut by the X-Y plane is circular (including flattened circular).

This configuration occurs, for example, when the shift amount of the positional alignment of the mask for making the through-holes TH is large. In this example, the width of the first through-hole TH1 along the Y axis is different from the width of the second through-hole TH2 along the Y axis.

Thus, even in the case where the shift amount of the positional alignment of the mask is large, the first distance d1 between the first through-hole TH1 and the partitioning insulating layer IL and the second distance d2 between the second through-hole TH2 and the partitioning insulating layer IL are maintained at constants.

Thus, in the nonvolatile semiconductor memory device 112 as well, the first distance d1 along the Y axis between the partitioning insulating layer IL and the ends of the first electrode films 61a on the partitioning insulating layer IL side is substantially the same as the second distance d2 along the Y axis between the partitioning insulating layer IL and the ends of the second electrode films 61b on the partitioning insulating layer IL side. In other words, the prescribed distance can be set between the first through-hole TH1 and the partitioning insulating layer IL and between the second through-hole TH2 and the partitioning insulating layer IL. Therefore, the desired electrical characteristics of the electrode films 61 are obtained. Accordingly, the size per memory cell MC can be reduced further and the storage density can be increased while maintaining the prescribed characteristics.

Figure 18:
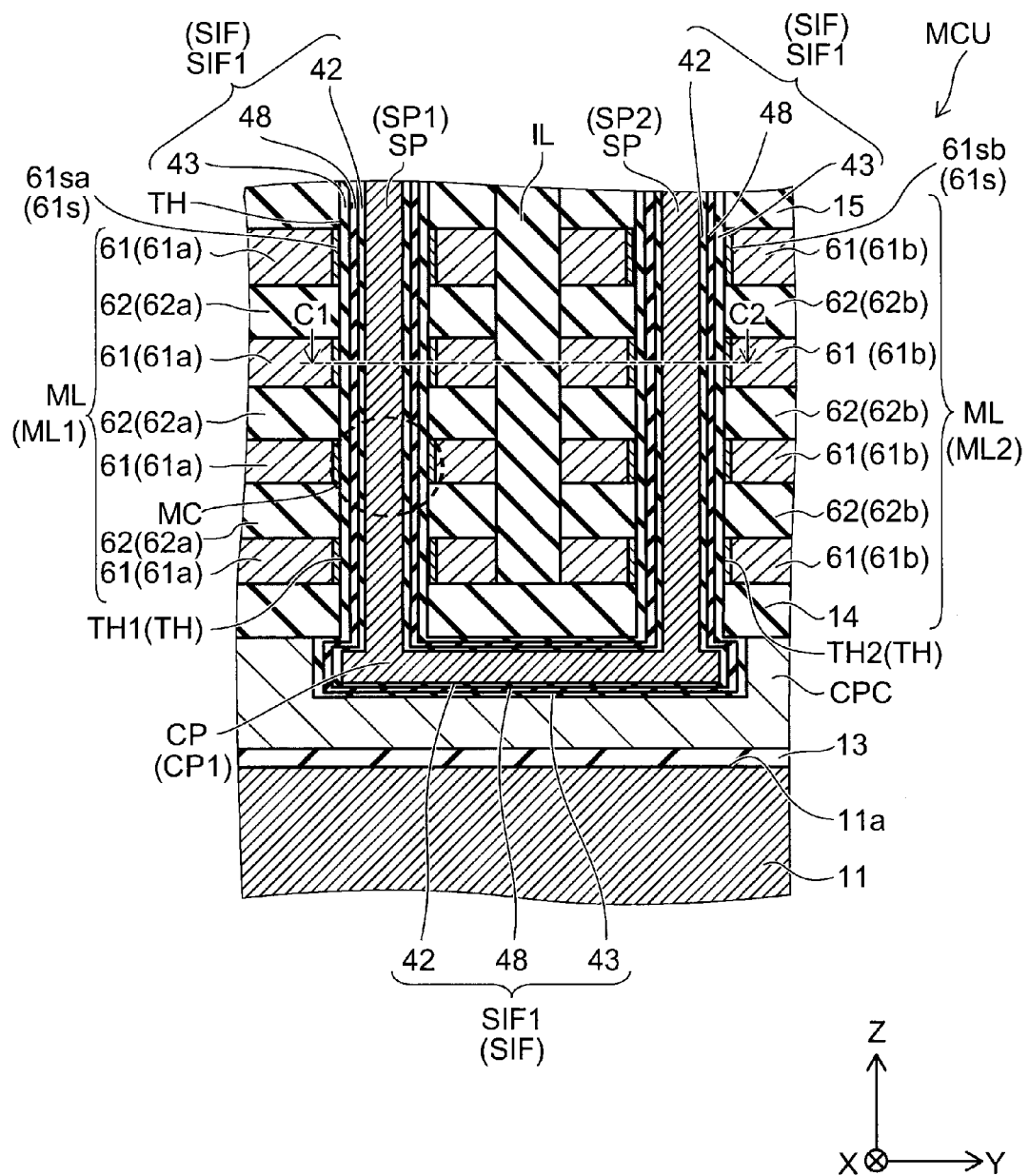
FIG. 18 is a schematic cross-sectional view illustrating the configuration of another nonvolatile semiconductor memory device according to the embodiment.

FIG. 18 is a schematic cross-sectional view illustrating the configuration of another nonvolatile semiconductor memory device according to the embodiment.

Namely, FIG. 18 illustrates the configuration of the memory cell array unit MCU of the nonvolatile semiconductor memory device 113 according to the embodiment.

Figure 19:
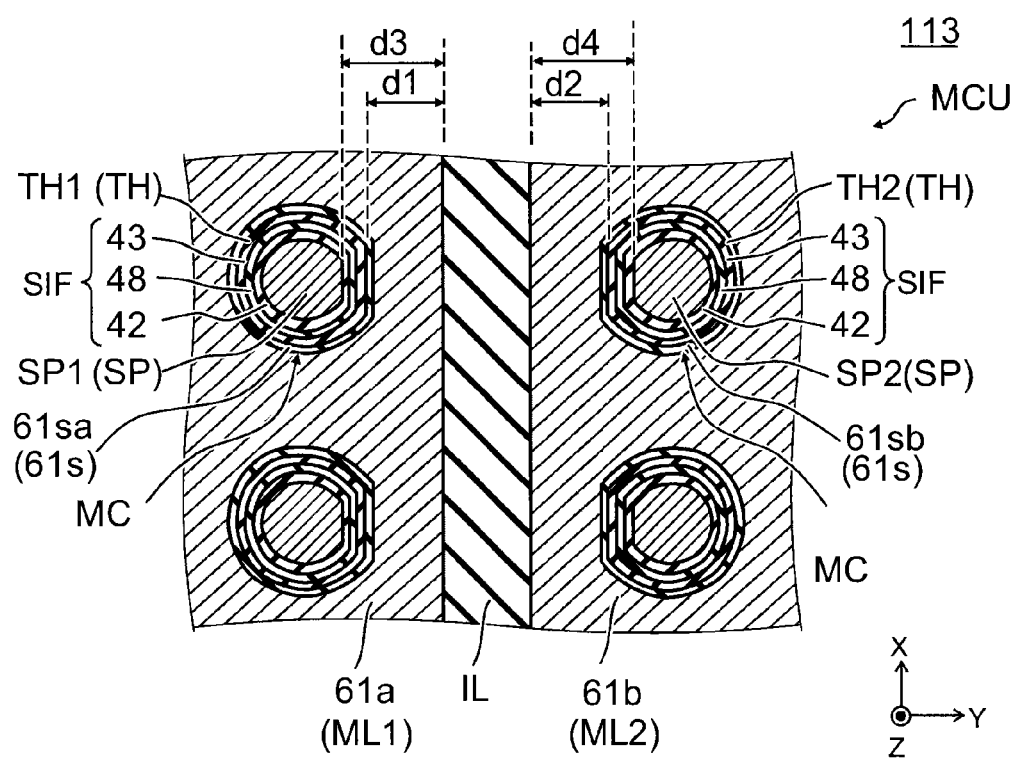
FIG. 19 is a schematic cross-sectional view illustrating the configuration of the nonvolatile semiconductor memory device according to the embodiment.

FIG. 19 is a schematic cross-sectional view illustrating the configuration of the nonvolatile semiconductor memory device according to the embodiment.

FIG. 19 is a cross-sectional view along line C1-C2 of FIG. 18.

In the nonvolatile semiconductor memory device 113 as illustrated in FIG. 18 and FIG. 19, the multiple first electrode films 61a have portions (first silicided portions 61sa) including silicide in contact with the memory film SIF. The multiple second electrode films 61b have portions (second silicided portions 61sb) including silicide in contact with the memory film SIF. Thus, the electrode films 61 may have silicided portions 61s including silicide and contacting the memory film SIF.

In such a case, for example, the first silicided portions 61sa (the portions of the first electrode films 61a including silicide in contact with the memory film SIF) are disposed around the portions of the memory film SIF opposing the first electrode films 61a. The second silicided portions 61sb (the portions of the second electrode films 61b including silicide and contacting the memory film SIF) are disposed around the portions of the memory film SIF opposing the second electrode films 61b.

Thereby, the electrical characteristics of the electrode films 61 improve; and the operating characteristics of the memory cells MC improve.

An example of a method for manufacturing the nonvolatile semiconductor memory device 113 will now be described.

FIG. 20A to FIG. 20C are schematic views illustrating the method for manufacturing the nonvolatile semiconductor memory device according to the embodiment.

Namely, these drawings illustrate processes after the processes illustrated in FIG. 14A to FIG. 14C. FIG. 20A is a schematic plan view. FIG. 20B is a cross-sectional view along line B1-B2 of FIG. 20A. FIG. 20C is a cross-sectional view along line A1-A2 of FIG. 20A.

The stacked bodies ML including the inter-electrode insulating films 62 and the electrode films 61 are formed as described in regard to FIG. 14A to FIG. 14C. Subsequently, as illustrated in FIG. 20A to FIG. 20B, portions of the electrode films 61 (the first electrode films 61a and the second electrode films 61b, etc.) are silicided via the through-holes TH (the first through-hole TH1, the second through-hole TH2, etc.). Thereby, the silicided portions 61s are formed in the electrode films 61 of the surface portions of the interior surfaces of the through-holes TH.

Subsequently, similarly to the methods described above, the memory film SIF is formed by sequentially forming the outer insulating film 43, the charge retaining film 48, and the inner insulating film 42 inside the through-holes TH. Then, the semiconductor pillars SP and the connection portions CP are formed by filling a semiconductor material into the remaining space of the through-holes TH.

In other words, the manufacturing method further includes forming the memory film SIF inside the first through-hole TH1 and the second through-hole TH2 and forming the first semiconductor pillar SP1 and the second semiconductor pillar SP2 by filling a semiconductor into the remaining space inside the first through-hole TH1 and the second through-hole TH2.

Subsequently, the nonvolatile semiconductor memory device 113 is formed by forming the selection gate electrodes SG, various interconnects, and various inter-layer insulating films.

In the nonvolatile semiconductor memory device 113 as well, the size per memory cell MC can be reduced further; and the storage density can be increased. Also, the operating characteristics of the memory cells MC can be improved.

In the manufacturing method recited above, the making of the first through-hole TH1 and the second through-hole TH2 (step S130) includes patterning the stacked main body MLf using a mask (e.g., the carbon film f7, etc.) that has openings of a curved configuration (the first curved configuration) corresponding to the configuration of the side surface of the first through-hole TH1 on the side opposite to the partitioning insulating layer IL and a curved configuration (the second curved configuration) corresponding to the configuration of the side surface of the second through-hole TH2 on the side opposite to the partitioning insulating layer IL.

For example, the first curved configuration has a protruding configuration protruding in the direction from the partitioning insulating layer IL toward the first through-hole TH1; and the second curved configuration has a protruding configuration protruding in the direction from the partitioning insulating layer IL toward the second through-hole TH2.

Thereby, the side surface of the first through-hole TH1 on the side opposite to the partitioning insulating layer IL can have a protruding configuration protruding in the direction from the partitioning insulating layer IL toward the first through-hole TH1. The side surface of the second through-hole TH2 on the side opposite to the partitioning insulating layer IL can have a protruding configuration protruding in the direction from the partitioning insulating layer IL toward the second through-hole TH2. Thereby, the curvature of the portion of the inner insulating film 42 on the side opposite to the partitioning insulating layer IL is larger than the curvature of the portion of the outer insulating film 43 on the side opposite to the partitioning insulating layer IL. Thereby, the relationship between the electric field of the inner insulating film 42 and the electric field of the outer insulating film 43 can be corrected; and the operations stabilize.

According to the embodiment, a nonvolatile semiconductor memory device having a higher storage density and a method for manufacturing the same are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nonvolatile semiconductor memory devices such as stacked bodies, electrode films, inter-electrode insulating films, charge retaining films, memory films, connection portions, partitioning insulating layers, substrates, interconnects, etc., from known art. Such practice is included in the scope of the invention to the extent that similar effects are obtained.

Further, any two or more components of the specific examples may be combined within the extent of technical feasibility and are included in the scope of the embodiments to the extent that the spirit of the embodiments is included.

Moreover, all nonvolatile semiconductor memory devices and methods for manufacturing nonvolatile semiconductor memory devices practicable by an appropriate design modification by one skilled in the art based on the nonvolatile semiconductor memory devices and the methods for manufacturing nonvolatile semiconductor memory devices described above as embodiments of the invention also are within the scope of the invention to the extent that the spirit of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a nonvolatile semiconductor memory device, the device including: a first stacked body including a plurality of first electrode films stacked along a first axis and a first inter-electrode insulating film provided between two of the first electrode films mutually adjacent along the first axis, a first through-hole being provided in the first stacked body to extend along the first axis; a first semiconductor pillar filled into the first through-hole to extend along the first axis; a second stacked body juxtaposed with the first stacked body along a second axis orthogonal to the first axis, the second stacked body including a plurality of second electrode films stacked along the first axis and a second inter-electrode insulating film provided between two of the second electrode films mutually adjacent along the first axis, a second through-hole being provided in the second stacked body to extend along the first axis; a second semiconductor pillar filled into the second through-hole to extend along the first axis; a connection portion electrically connecting the first semiconductor pillar to the second semiconductor pillar; a partitioning insulating layer provided between the first stacked body and the second stacked body to partition the plurality of first electrode films from the plurality of second electrode films; and a memory film provided between the first semiconductor pillar and the plurality of first electrode films and between the second semiconductor pillar and the plurality of second electrode films, the method comprising:

forming the partitioning insulating layer in a stacked main body used to form the first stacked body and the second stacked body;

forming a sidewall mask layer on a sidewall of a portion of the partitioning insulating layer; and making the first through-hole and the second through-hole in the stacked main body by using the sidewall mask layer as a portion of a mask.

2. The method according to claim 1, wherein the making of the first through-hole and the second through-hole includes patterning the stacked main body by using a mask having openings, the openings having a curved configuration corresponding to a configuration of a side surface of the first through-hole on a side opposite to the partitioning insulating layer and a curved configuration corresponding to a configuration of a side surface of the second through-hole on a side opposite to the partitioning insulating layer.

3. The method according to claim 2, wherein:
the curved configuration corresponding to the configuration of the side surface of the first through-hole on the side opposite to the partitioning insulating layer has a protruding configuration protruding in a direction from the partitioning insulating layer toward the first through-hole; and
the curved configuration corresponding to the configuration of the side surface of the second through-hole on the side opposite to the partitioning insulating layer has a protruding configuration protruding in a direction from the partitioning insulating layer toward the second through-hole.

4. The method according to claim 2, wherein:
the making of the first through-hole and the second through-hole includes
forming a first parallel portion in a side surface of the first through-hole on the partitioning insulating layer side, the first parallel portion being parallel to a plane including the first axis and a third axis orthogonal to the first and second axes, and
forming a first curved portion in a side surface of the first through-hole on a side opposite to the partitioning insulating layer, the first curved portion reflecting the curved configuration the of the openings.

5. The method according to claim 4, wherein:
the making of the first through-hole and the second through-hole further includes
forming a second parallel portion in a side surface of the second through-hole on the partitioning insulating layer side, the second parallel portion being parallel to the plane, and
forming a second curved portion in a side surface of the second through-hole on a side opposite to the partitioning insulating layer, the second curved portion reflecting the curved configuration the of the openings.

6. The method according to claim 1, wherein the making of the first through-hole and the second through-hole includes forming a portion parallel to a plane including the first axis and a third axis orthogonal to the first and second axes in at least one selected from a side surface of the first through-hole on the partitioning insulating layer side and a side surface of the second through-hole on the partitioning insulating layer side.

7. The method according to claim 1, wherein the forming of the sidewall mask layer includes forming a sacrificial layer to cover an upper portion of the partitioning insulating layer and removing the sacrificial layer except for a portion of the sacrificial layer opposing the sidewall of the partitioning insulating layer.

8. The method according to claim 1, further comprising:
forming a memory film inside the first through-hole and the second through-hole; and
forming the first semiconductor pillar and the second semiconductor pillar by filling a semiconductor into a remaining space inside the first through-hole and the second through-hole.

9. The method according to claim 8, wherein the forming of the first semiconductor pillar and the second semiconductor pillar includes causing a distance along the second axis from the partitioning insulating layer to an end of the first semiconductor pillar on the partitioning insulating layer side to be the same as a distance along the second axis from the partitioning insulating layer to an end of the second semiconductor pillar on the partitioning insulating layer side.

10. The method according to claim 1, further comprising siliciding a portion of the first electrode film and siliciding a portion of the second electrode film via the first through-hole and the second through-hole.

11. The method according to claim 10, further comprising
forming a memory film inside the first through-hole and the second through-hole and
forming the first semiconductor pillar and the second semiconductor pillar by filling a semiconductor into a remaining space inside the first through-hole and the second through-hole
after the siliciding of the portion of the first electrode film and the siliciding of the portion of the second electrode film.

* * * * *